(12) United States Patent
Chang

(10) Patent No.: US 12,364,019 B2
(45) Date of Patent: *Jul. 15, 2025

(54) DEEP TRENCH CAPACITOR FUSE STRUCTURE FOR HIGH VOLTAGE BREAKDOWN DEFENSE AND METHODS FOR FORMING THE SAME

(71) Applicant: Taiwan Semiconductor Manufacturing Company Limited, Hsinchu (TW)

(72) Inventor: Jen-Yuan Chang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/428,844

(22) Filed: Jan. 31, 2024

(65) Prior Publication Data

US 2024/0222358 A1    Jul. 4, 2024

Related U.S. Application Data

(63) Continuation of application No. 17/461,133, filed on Aug. 30, 2021, now Pat. No. 11,923,355.

(51) Int. Cl.
| | |
|---|---|
| *H10D 89/60* | (2025.01) |
| *H01L 23/522* | (2006.01) |
| *H10D 84/01* | (2025.01) |
| *H10D 84/03* | (2025.01) |
| *H10D 1/00* | (2025.01) |
| *H10D 1/68* | (2025.01) |

(52) U.S. Cl.
CPC ......... *H10D 89/60* (2025.01); *H01L 23/5226* (2013.01); *H10D 84/0112* (2025.01); *H10D 84/0149* (2025.01); *H10D 84/038* (2025.01); *H10D 1/042* (2025.01); *H10D 1/714* (2025.01); *H10D 1/716* (2025.01)

(58) Field of Classification Search
CPC ............ H01L 27/0248; H01L 21/8222; H01L 21/823475; H01L 23/5226; H01L 28/87; H01L 28/91; H10D 89/60; H10D 84/0112; H10D 84/038; H10D 84/0149; H10D 1/716; H10D 1/042; H10D 1/714
USPC .......................................................... 257/303
See application file for complete search history.

(56) References Cited

U.S. PATENT DOCUMENTS 11,923,355 B2 * 3/2024 Chang ................. H01L 27/0248
2001/0035549 A1 11/2001 Forbes et al.
(Continued)

*Primary Examiner* — Tu-Tu V Ho
(74) *Attorney, Agent, or Firm* — The Marbury Law Group, PLLC

(57) ABSTRACT

Devices and methods for manufacturing a deep trench capacitor fuse for high voltage breakdown defense. A semiconductor device comprising a deep trench capacitor structure and a transistor structure. The transistor structure may comprise a base, a first terminal formed within the base, and a second terminal formed within the base. The first terminal and the second terminal may be formed by doping the base. The deep trench capacitor structure may comprise a first metallic electrode layer and a second metallic electrode layer. The first terminal may be electrically connected to the first metallic electrode layer, and the second terminal may be electrically connected to the second metallic electrode layer.

20 Claims, 18 Drawing Sheets

(56) References Cited

U.S. PATENT DOCUMENTS

2007/0001203 A1\* 1/2007 Lehr ................. H01L 29/945
257/296
2008/0121889 A1   5/2008 Ishiguro
2020/0161373 A1   5/2020 Cheng et al.
2021/0091169 A1   3/2021 Lin et al.

\* cited by examiner

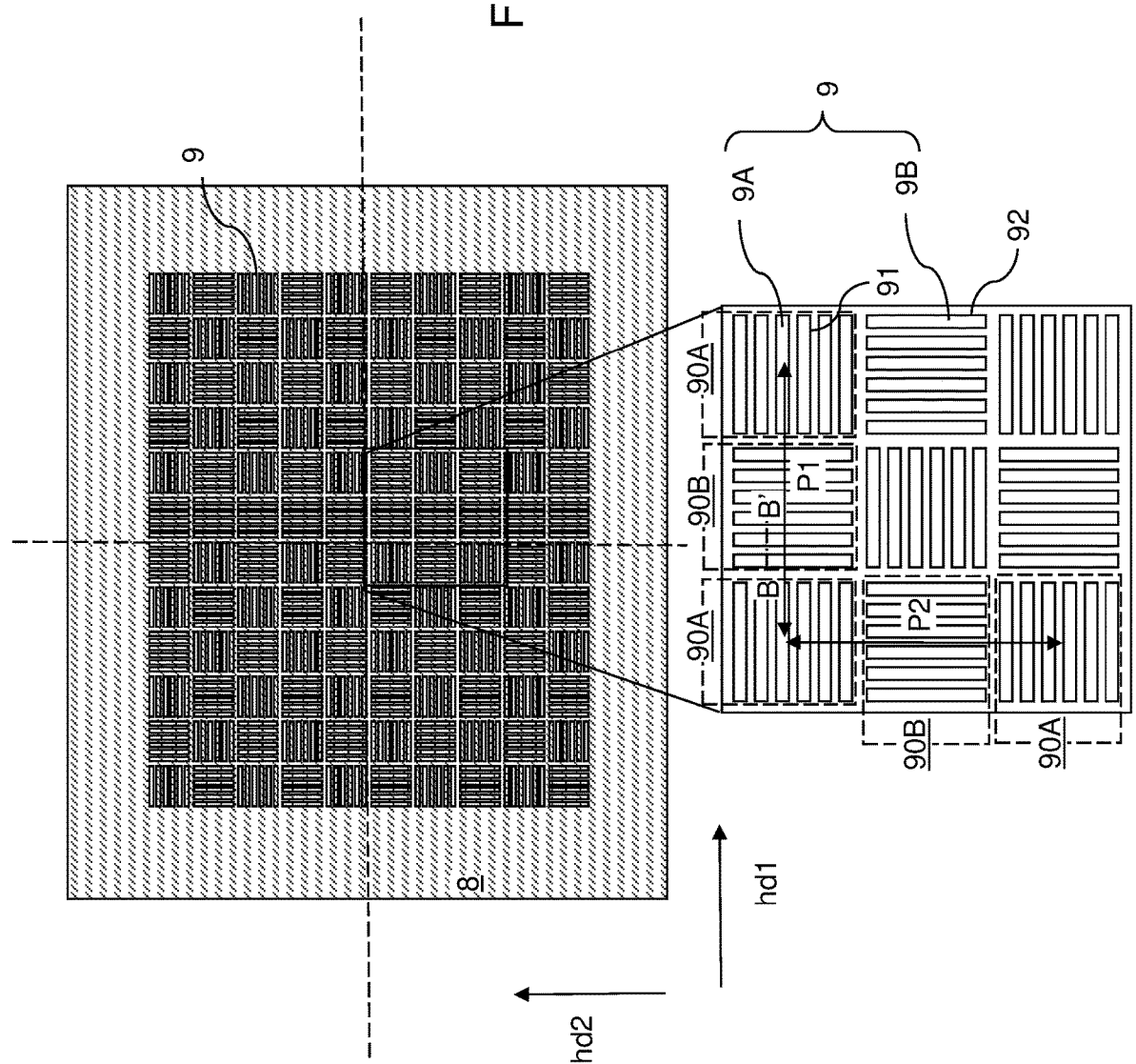

ns in direct
DEEP TRENCH CAPACITOR FUSE STRUCTURE FOR HIGH VOLTAGE BREAKDOWN DEFENSE AND METHODS FOR FORMING THE SAME

RELATED APPLICATION

This application is a continuation of, and claims priority to, U.S. Non-Provisional patent application Ser. No. 17/461,133, entitled "Deep Trench Capacitor Fuse Structure for High Voltage Breakdown Defense and Methods for Forming the Same," filed on Aug. 30, 2021, the entire contents of which are hereby incorporated by reference for all purposes.

BACKGROUND

Deep trench capacitors (DTCs) are used in semiconductor chips for many applications such as power supply stabilization. DTCs may provide high capacitance while possessing a small device footprint.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a top-down view of the exemplary structure after formation of deep trenches in the substrate according to an embodiment of the present disclosure. An inset illustrates a magnified view of a region of the exemplary structure.

DETAILED DESCRIPTION

Figure 1B:
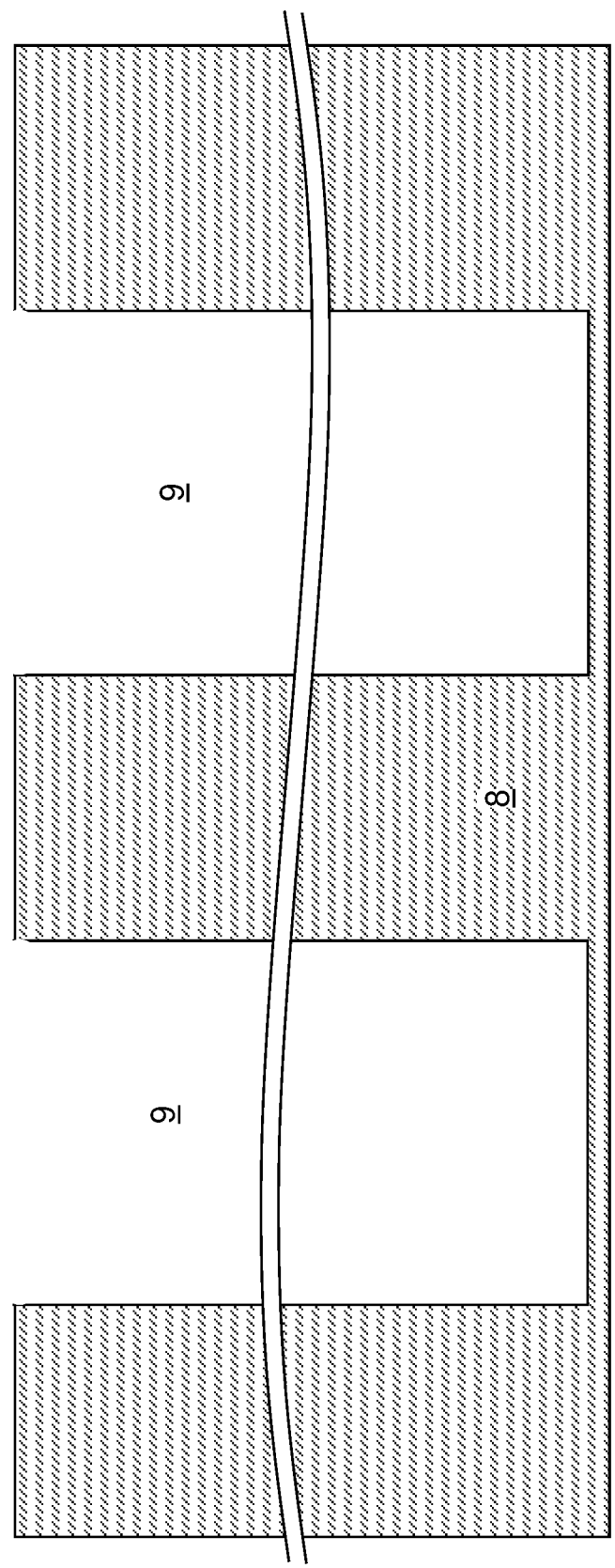
FIG. 1B is a vertical cross-sectional view of a region of the exemplary structure along the vertical plane B-B' of FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

DTCs are semiconductor devices, often integrated in logic dies, that may be used to provide capacitance to densely populated integrated circuits. DTCs may provide higher capacitance per unit area over other solutions, such as a metal-insulator-metal (MIM) capacitor, since DTCs may be formed vertically downward into a substrate. The vertical orientation further allows DTCs to be placed more closely to other semiconductor logic devices. Two or more DTCs may further be coupled together in series to further increase achievable capacitance in high density semiconductor fabrications. DTCs may be formed having layer stack of two or more alternating conductive material layers (e.g., metallic electrode layers) and isolating, nonconductive material layers (e.g., node dielectric layers).

Electrical breakdown or dielectric breakdown may occur when an insulating material is subjected to a high enough voltage that it becomes electrically conductive, allowing the flow of current. A dielectric material may experience voltage breakdown when the electric field caused by an applied voltage exceeds the dielectric strength of the dielectric material. Within a DTC, voltage breakdown may occur when the voltage differential between two metallic electrode layers is large enough to cause the insulating node dielectric layer between the metallic electrode layers to become conductive. A voltage breakdown event that occurs within a DTC may cause significant structural damage such as bending, separating, breaking, or otherwise misshaping the various layers within the DTC layer stack. Misshapen or broken DTC layers may lead to incorrect capacitance values, inoperable capacitors (i.e., shorted or open circuits), and/or associated logic device failures including total semiconductor failure. This may be especially problematic as DTCs are being designed to be more compact with increasingly thinner layers, which may be more susceptible to physical deformities and voltage breakdown. The thickness of each metallic electrode layer may be as thin as 5 nanometers (nm), and the thickness of each node dielectric layer may be as thin as 1 nm. The thinness of each layer within a DTC layer stack may increase the potential for structural damage to occur, especially during high voltage events.

Formation of a transistor device, such as a bipolar junction transistor (BJT), "BJT-like" structure, metal-oxide-semiconductor field-effect transistor (MOSFET), or "FET-like" device coupled to DTC may be used to eliminate or reduce the impact of high voltage breakdown events that may occur within DTCs. Terminals of a BJT (collector, emitter), terminals of a MOSFET (source, drain, gate), or terminals of a "transistor-like" device (N-doped or P-doped regions) may be respectively connected to alternating layers of a DTC layer stack. For example, one metallic electrode layer of a DTC layer stack may be electrically connected to a collector of a BJT, and another adjacent metallic electrode layer of the DTC layer stack, separated by a node dielectric layer, may be electrically connected to an emitter of the same BJT. The BJT may be designed such that its own breakdown voltage value is less than that of the node dielectric layer. Thus, before the voltage differential between the two adjacent metallic electrode layers reaches the voltage breakdown value for the node dielectric layer, the BJT may activate, or induce a voltage breakdown between its terminals or doped regions, to begin relaying current between the emitter and collector, effectively dissipating the excess voltage by reducing the voltage differential and attempting to reach a voltage equilibrium between the two metallic electrode layers. After the transistor or transistor-like device discharges the high voltage that may have otherwise caused a voltage breakdown event within the DTC, the capacitor may continue to operate normally.

The various embodiments are directed to semiconductor devices, and specifically to a deep trench capacitor (DTC) fuse for high voltage breakdown defense and methods of forming the same. Various embodiment DTCs and methods may be used to eliminate or reduce the impact of high voltage breakdown events within DTCs, the various aspects of which are described herebelow.

FIG. 1A is a top-down view of the exemplary structure after formation of deep trenches in the substrate according to an embodiment of the present disclosure. An inset illustrates a magnified view of a region of the exemplary structure. FIG. 1B is a vertical cross-sectional view of a region of the exemplary structure along the vertical plane B-B' of FIG. 1A.

Referring to FIGS. 1A and 1B, deep trenches 9 extending downward from a front surface of a substrate 8 toward a backside surface of the substrate 8 may be formed. For example, a patterned etch mask layer may be formed on the front side surface of the substrate 8. The pattern in the patterned etch mask layer may be transferred into an upper portion of the substrate 8. An optional pad dielectric layer (not shown) such as a silicon oxide pad layer may be formed on the front side surface, i.e., the top surface, of the substrate 8 prior to formation of the patterned etch mask layer. In an exemplary embodiment, the pad dielectric layer may include a silicon oxide layer having a thickness in a range from 20 nm to 100 nm, although thicker or thinner pad dielectric layers may be used. The patterned etch mask layer may include a silicon nitride layer or a borosilicate glass (BSG) layer having a thickness in a range from 200 nm to 600 nm, although different materials and/or lesser or greater thicknesses may also be used for the optional pad dielectric layer and the patterned etch mask layer. The patterned etch mask layer may be formed by depositing a blanket etch mask layer. Then, a lithographically patterned photoresist layer may be formed over the blanket etch mask layer. The pattern in the lithographically patterned photoresist layer may be transferred through the blanket etch mask layer using an anisotropic etch process such as a reactive ion etch process.

An anisotropic etch process may be performed to transfer the pattern in the patterned etch mask layer through an upper portion of the substrate 8 to form the deep trenches 9. For example, a reactive ion etch process using a combination of gases including HBr, $NF_3$, $O_2$, and $SF_6$ may be used to form the deep trenches 9. The depth of the deep trenches 9 may be in a range from 2 micron to 20 microns, such as from 3 microns to 10 microns, although deeper or shallower trenches may be used. The horizontal cross-sectional shape of each deep trench 9 may have a shape of a circle, an ellipse, a rectangle, a rounded rectangle, an annulus having an inner periphery and an outer periphery of various shapes, or of any three-dimensional shape that defines an enclosed volume. Generally, at least one deep trench 9 extending downward from a top surface of the substrate may be formed in the substrate 8. The at least one deep trench 9 may comprise a plurality of deep trenches 9 having a depth that is greater than 2 microns. Each deep trench 9 may be formed within a respective device area that is laterally surrounded by a respective conductive metallic substrate enclosure structure 4.

In one embodiment, each of the deep trenches 9 may be laterally elongated with a uniform width. A predominant portion (such as more than 50% of the entire area) of each deep trench 9 may have a width that is sufficient to accommodate vertically-extending portions of all metallic electrode layers and at least two node dielectric layers to be subsequently formed. For example, a predominant portion of each deep trench 9 may have a width that is sufficient to accommodate vertically-extending portions of at least three metallic electrode layers and at least two node dielectric layers. In an illustrative example, a predominant portion of each deep trench 9 may have a width that is in a range from 50 nm to 1,000 nm, although lesser and greater widths may also be used.

In one embodiment, first-type deep trenches 9A and second-type deep trenches 9B may be formed into an upper portion of the substrate 8. The first-type deep trenches 9A may have first lengthwise sidewalls 91 that laterally extend along a first horizontal direction hd1 and the second-type deep trenches 9B may have second lengthwise sidewalls 92 that laterally extend along a second horizontal direction hd2 that is different from the first horizontal direction hd1. In one embodiment, the second horizontal direction hd2 may be perpendicular to the first horizontal direction hd1.

In one embodiment, each of the first-type deep trenches 9A and the second-type deep trenches 9B may have a length-to-width ratio in a range from 3 to 30. In one embodiment, each of the first-type deep trenches 9A and the second-type deep trenches 9B has a depth-to-width ratio in a range from 10 to 200. In one embodiment, each of the first-type deep trenches 9A and the second-type deep trenches 9B has a depth in a range from 2 micron to 20 microns.

In one embodiment, clusters 90A that are subsets of the first-type deep trenches 9A and clusters 90B that are subsets of the second-type deep trenches 9B may laterally alternate along at least one direction that is selected from the first horizontal direction hd1 and the second horizontal direction hd2. The second horizontal direction hd2 may be perpendicular to the first horizontal direction hd1. In one embodiment, the clusters 90A that are subsets of the first-type deep trenches 9A and clusters 90B that are subsets of the second-type deep trenches 9B may laterally alternate along the first horizontal direction hd1 and along the second horizontal direction hd2. In the illustrated example, each cluster of a subset of the first-type deep trenches 9A may include six first-type deep trenches 9A, and each cluster of a subset of the second-type deep trenches 9B may include six second-type deep trenches 9B.

In one embodiment, the first-type deep trenches 9A and the second-type deep trenches 9B may comprise a two-dimensional array of deep trenches 9 in which the first-type deep trenches 9A are arranged as a first two-dimensional periodic array and the second-type deep trenches 9B are arranged as a second two-dimensional periodic array that is interlaced with the first two-dimensional periodic array. In one embodiment, each of the first two-dimensional periodic array and the second two-dimensional periodic array has a first periodic pitch P1 along the first horizontal direction hd1 and has a second periodic pitch hd2 along the second horizontal direction hd2. In one embodiment, the second two-dimensional periodic array may be laterally offset along the first horizontal direction hd1 by one half of the first periodic pitch P1, and may be laterally offset along the second horizontal direction hd2 by one half of the second periodic pitch P2.

The photoresist layer may be removed prior to the anisotropic etch process that forms the deep trenches 9, or may be consumed during the anisotropic etch process that forms the deep trenches 9. The patterned etch mask layer and the optional dielectric pad layer may be subsequently removed, for example, by a respective isotropic etch process such as a wet etch process.

Figure 1C:
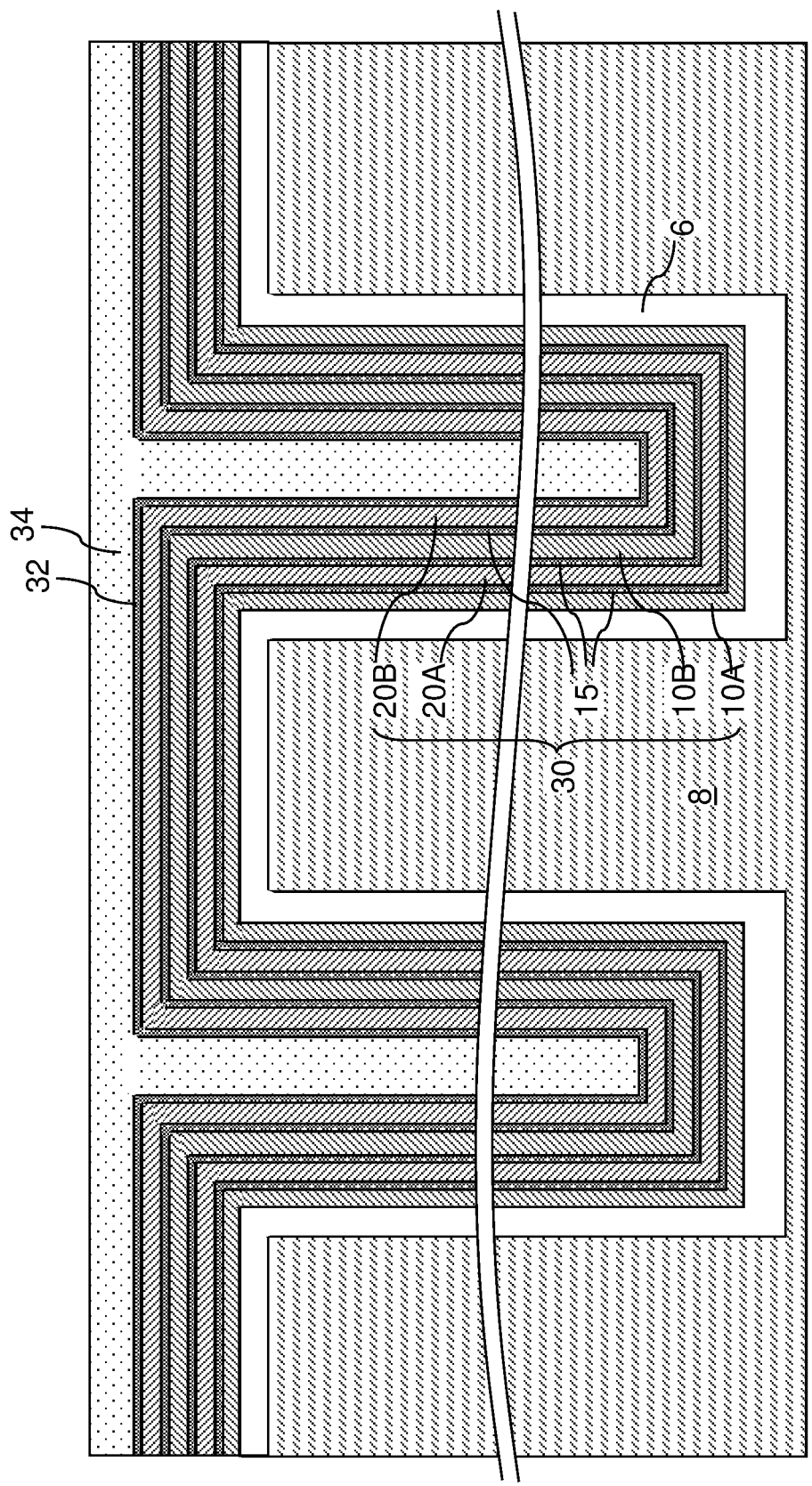
FIG. 1C is a vertical cross-sectional view of a region of the exemplary structure after formation of a layer stack including at least three metallic electrode layers interlaced with at least two node dielectric layers according to an embodiment of the present disclosure.

FIG. 1C is a vertical cross-sectional view of a region of the exemplary structure after formation of a layer stack including at least three metallic electrode layers interlaced with at least two node dielectric layers according to an embodiment of the present disclosure. Referring to FIG. 1C, a dielectric liner 6 may be formed on the physically exposed surface of the semiconductor substrate 8 including the top surface of the semiconductor substrate 8 and sidewalls of the deep trenches 9. The dielectric liner 6 may include a dielectric material that provides electrical isolation between the DTCs to be subsequently formed and the substrate 8. For example, the dielectric liner 6 may include silicon oxide, silicon nitride, silicon oxynitride, and/or a dielectric metal oxide. Other suitable dielectric liner materials within the contemplated scope of disclosure may also be used. In an illustrative example, the dielectric liner 6 may include a silicon oxide layer formed by thermal oxidation of surface portions of the substrate 8 that includes silicon. The thickness of the dielectric liner 6 may be in a range from 4 nm to 100 nm, although lesser and greater thicknesses may also be used.

An alternating layer stack 30 of metallic electrode layers (10A, 20A, 10B, 20B) and node dielectric layers 15 may be formed by a respective conformal deposition process. The alternating layer stack 30 includes at least three metallic electrode layers (e.g., 10A, 20A, 10B, 20B) interlaced with at least two node dielectric layers 15, and continuously extending over the top surface of the semiconductor substrate 8 and into each of the at least one deep trench 9. The alternating layer stack 30 may continuously extend into each deep trench 9. A cavity may be present in an unfilled volume of each the deep trench 9. Generally, the at least three metallic electrode layers (10A, 20A, 10B, 20B) and the at least two node dielectric layers 15 are deposited by a respective conformal deposition process.

Each of the metallic electrode layers (10A, 20A, 10B, 20B) may include a metallic material, which may comprise, and/or consist essentially of, a conductive metallic nitride, an elemental metal, or an intermetallic alloy. In one embodiment, each metallic electrode layer (10A, 20A, 10B, 20B) comprises, and/or consists essentially of, a conductive metallic nitride material, which may be a metallic diffusion barrier material. For example, each metallic electrode layer (10A, 20A, 10B, 20B) may include, and/or may consist essentially of, a conductive metallic nitride material such as TiN, TaN, or WN. Other suitable materials within the contemplated scope of disclosure may also be used.

Use of a metallic diffusion barrier material for the metallic electrode layers (10A, 20A, 10B, 20B) may be advantageous because diffusion of metallic elements through the node dielectric layers 15 and/or through the dielectric liner 6 may cause deleterious effects for DTCs. Each metallic electrode layer (10A, 20A, 10B, 20B) may be formed by a conformal deposition process such as chemical vapor deposition (CVD) or atomic layer deposition (ALD). The thickness of each metallic electrode layer (10A, 20A, 10B, 20B) may be in a range from 5 nm to 50 nm, such as from 10 nm to 30 nm, although lesser and greater thicknesses may also be used. In one embodiment, each metallic electrode layer (10A, 20A, 10B, 20B) may have the same material composition and the same thickness. In another embodiment, each metallic electrode layer (10A, 20A, 10B, 20B) may have the same material composition but have varying thicknesses. In yet another embodiment, each metallic electrode layer (10A, 20A, 10B, 20B) may have different material composition and the same thickness. In yet another embodiment, each metallic electrode layer (10A, 20A, 10B, 20B) may have different material composition and different thicknesses.

Each of node dielectric layers 15 may include a node dielectric material, which may be a dielectric metal oxide material having a dielectric constant greater than 7.9 (which is the dielectric constant of silicon nitride), i.e., a "high-k"

dielectric metal oxide material, or may include silicon nitride. For example, the node dielectric layer 15 may include a dielectric metal oxide material such as aluminum oxide, hafnium oxide, zirconium oxide, tantalum oxide, lanthanum oxide, an alloy or a silicate thereof, and/or a layer stack thereof. In one embodiment, the node dielectric layer 15 may include amorphous aluminum oxide layer that may be subsequently annealed into polycrystalline aluminum oxide material after formation of contact via structures. Other suitable materials within the contemplated scope of disclosure may also be used.

Each node dielectric layer 15 may be formed by a conformal deposition process such as chemical vapor deposition (CVD) or atomic layer deposition (ALD). The thickness of each node dielectric layer 15 may be in a range from 1 nm to 20 nm, such as from 3 nm to 12 nm, although lesser and greater thicknesses may also be used. In one embodiment, each node dielectric layer 15 may have the same material composition and the same thickness. In another embodiment, each node dielectric layer 15 may have the same material composition but have varying thicknesses. In yet another embodiment, each node dielectric layer 15 may have different material composition and the same thickness. In yet another embodiment, each node dielectric layer 15 may have different material composition and different thicknesses. For example, in an embodiment, a first node dielectric layer 15 may be thinner than a second node dielectric layer 15.

The total number of the metallic electrode layers (10A, 20A, 10B, 20B) may be in a range from 3 to 16, such as from 4 to 8. The total number of the node dielectric layers 15 may be one less than the total number of the metallic electrode layers (10A, 20A, 10B, 20B).

While the present disclosure is described using an embodiment in which the alternating layer stack 30 of the metallic electrode layers (10A, 20A, 10B, 20B) and the node dielectric layers 15 include four metallic electrode layers (10A, 20A, 10B, 20B) and three node dielectric layers 15, embodiments are expressly contemplated herein in which different numbers of metallic electrode layers (10A, 20A, 10B, 20B) and different numbers of node dielectric layers 15 may be used within the alternating layer stack 30. Generally, an alternating layer stack 30 may include at least three metallic electrode layers (10A, 20A, 10B, 20B) interlaced with at least two node dielectric layers 15 that may be formed in, and over, at least one deep trench 9 formed in a substrate 8.

The metallic electrode layers (10A, 20A, 10B, 20B) may be sequentially numbered in the order of deposition. For example, the metallic electrode layers (10A, 20A, 10B, 20B) may include a first metallic electrode layer 10A, a second metallic electrode layer 20A, a third metallic electrode layer 10B, a fourth metallic electrode layer 20B, etc. Patterned portions of each odd-numbered metallic electrode layer (10A, 10B) may be subsequently used to form a primary electrode assembly that functions as a primary node, i.e., a first node, of a DTC, and patterned portions of each even-numbered metallic electrode layer (20A, 20B) may be subsequently used to form a complementary electrode assembly that functions as a complementary node, i.e., a second node, of the DTC. The total number of the metallic electrode layers (10A, 20A, 10B, 20B), the thicknesses of the metallic electrode layers (10A, 20A, 10B, 20B), and the width of the deep trenches 9 may be selected such that a predominant portion (i.e., more than 50%) of the entire volume of each deep trench 9 may be filled with the alternating layer stack 30 without completely filling the deep trench 9.

A capping dielectric material layer 32 and a dielectric fill material layer 34 may be optionally deposited over the alternating layer stack 30. The capping dielectric material layer 32 may include a same dielectric material as the node dielectric layers 15, and may have a thickness in a range from 1 nm to 20 nm, such as from 3 nm to 12 nm, although lesser and greater thicknesses may also be used.

The dielectric fill material layer 34 may be deposited on the capping dielectric material layer 32 or on the alternating layer stack 30 to fill the volumes of cavities that remain in the deep trenches 9. In one embodiment, the dielectric fill material layer 34 comprises, and/or consists essentially of, undoped silicate glass or a doped silicate glass.

Figure 2A:
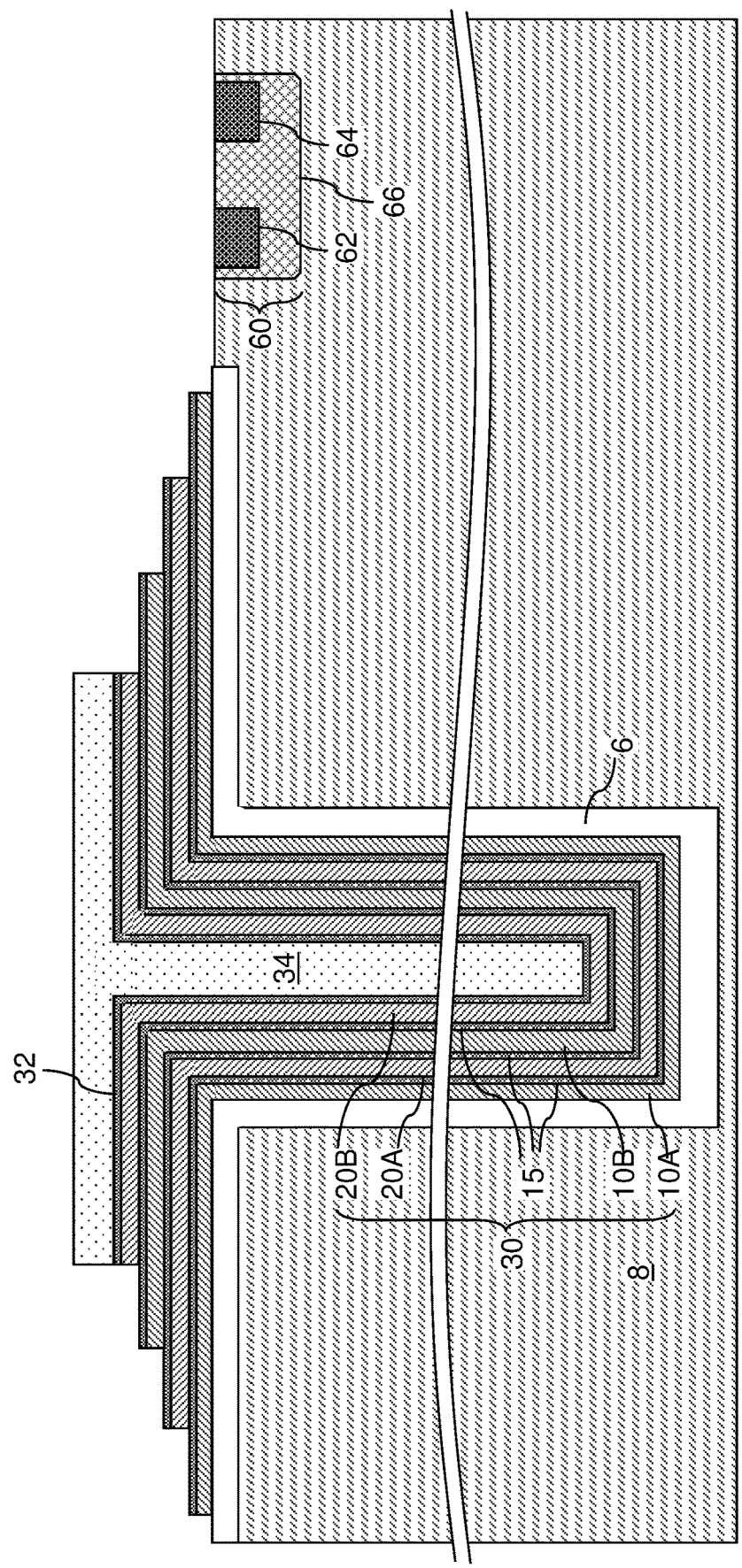
FIG. 2A is a vertical cross-sectional view along line A-A' in FIG. 2B of a peripheral region of the exemplary structure after patterning the layer stack according to an embodiment of the present disclosure.
Figure 2B:
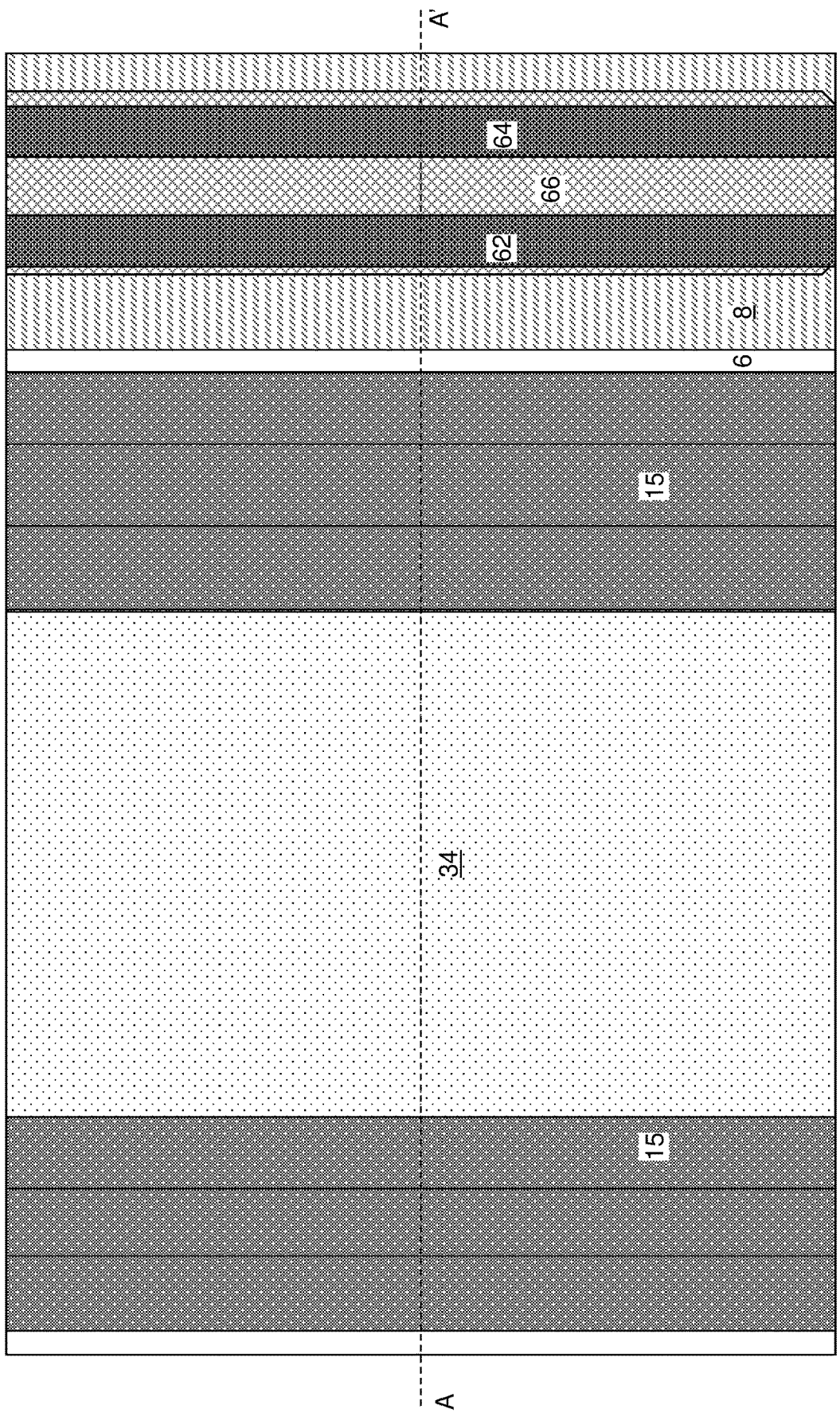
FIG. 2B is a top view of the structures shown in FIG. 2A.

FIG. 2A is a vertical cross-sectional view along line A-A' in FIG. 2B of a peripheral region of the exemplary structure after patterning the layer stack according to an embodiment of the present disclosure. FIG. 2B is a top view of the structures shown in FIG. 2A. For ease of illustration, one DTC is shown. However, additional DTCs may be implemented in series and formed as described with respect to FIGS. 1A-1C. Referring to FIGS. 2A and 2B, a trimmable mask layer may be applied over the dielectric fill material layer 34. The trimmable mask layer may be lithographically patterned to cover the area of the deep trenches 9. The entire periphery of the trimmable mask layer may be located outside the area of the deep trenches 9. A first set of etch processes may be performed to etch unmasked portions of the dielectric fill material layer 34, the optional capping dielectric material layer 32, and the topmost layer selected from the metallic electrode layers (10A, 10B, 20A, 20B). The first set of etch processes may include a set of wet etch processes.

Subsequently, the trimmable mask layer may be trimmed to laterally recess the periphery of the trimmable mask layer and to increase the area unmasked by the trimmable mask layer. A second set of etch processes may be performed to etch unmasked portions of the dielectric fill material layer 34, the optional capping dielectric material layer 32, unmasked portions of the topmost one of the node dielectric layers 15, and unmasked underlying portions of the metallic electrode layers (10A, 10B, 20A, 20B).

The trimming of the trimmable mask layer and additional sets of etch processes may be repeated to provide stepped surfaces for the metallic electrode layers (10A, 10B, 20A, 20B). The trimmable mask layer may be subsequently removed, for example, by ashing or by dissolution in a solvent. Thus, a trench capacitor structure may be formed. The trench capacitor structure may include a layer stack including at least two metallic electrode layers (10A, 10B, 20A, 20B) interlaced with at least one node dielectric layer 15. Each layer within the layer stack comprises a horizontally-extending portion that overlies a front surface of the substrate 8 and vertically-extending portions located within a respective one of the deep trenches 9.

A transistor structure 60 may be formed within the substrate 8. A trench may be etched within the substrate 8 to form a cavity (not shown) to deposit a substrate, or base 66, of the transistor structure 60. In one embodiment, the base 66 may be formed through a series of etching, deposition, and chemical mechanical polishing processes to form the base 66 having a top surface that may be planarized with a top surface of the substrate 8. The base 66 may be formed from N-type or P-type materials that are suitable for doping with P-type or N-type impurities respectively.

The base 66 may be doped with impurities to form doped regions, or first terminal 62 and a second terminal 64, that have top surfaces on a same horizontal plane as the top surface of the substrate 8 and the topmost, exposed, undoped portions of the base 66. For example, the first terminal 62 and the second terminal 64 may be formed within the base 66 by ion-implantation processes, or the like. A P-type base 66 may be doped with N-type impurities to form N-type regions or terminals. Likewise, an N-type base 66 may be doped with P-type impurities to form P-type regions or terminals. In some embodiments, the base 66 may utilize suitable semiconductor materials such as polysilicon, amorphous silicon, or a semiconducting oxide, such as InGaZnO (IGZO), indium tin oxide (ITO), InWO, InZnO, InSnO, GaOx, InOx, and other non-silicon materials to form the first terminal 62 and the second terminal 64. In one embodiment, the distance between proximate sidewalls of the first terminal 62 and the second terminal 64 may be greater than 5 micrometers.

In one embodiment, the transistor structure 60 may be a BJT or BJT-like structure, and the first terminal 62 and second terminal 64 may either be referred to as an emitter or collector. In one embodiment, the transistor structure 60 may be a MOSFET, or FET-like structure, and the first terminal 62 and second terminal 64 may either be referred to as a source or drain. In embodiments in which the transistor structure 60 is a MOSFET, or FET-like structure, the transistor structure 60 may further include a gate (not shown) subsequently formed after doping the base 66 to create the first terminal 62 and the second terminal 64. A MOSFET transistor structure 60 may further include forming a channel (not shown) between the first terminal 62 and the second terminal 64. For example, a channel region of the transistor structure 60 may be disposed between the first terminal 62 and the second terminal 64 (i.e., between source and drain regions). The channel region may include P-type or N-type impurities that are different from the P-type or N-type impurities doped into the first terminal 62 and the second terminal 64, such that the channel region has a different conductivity-type than the first terminal 62 and the second terminal 64.

Figure 3A:
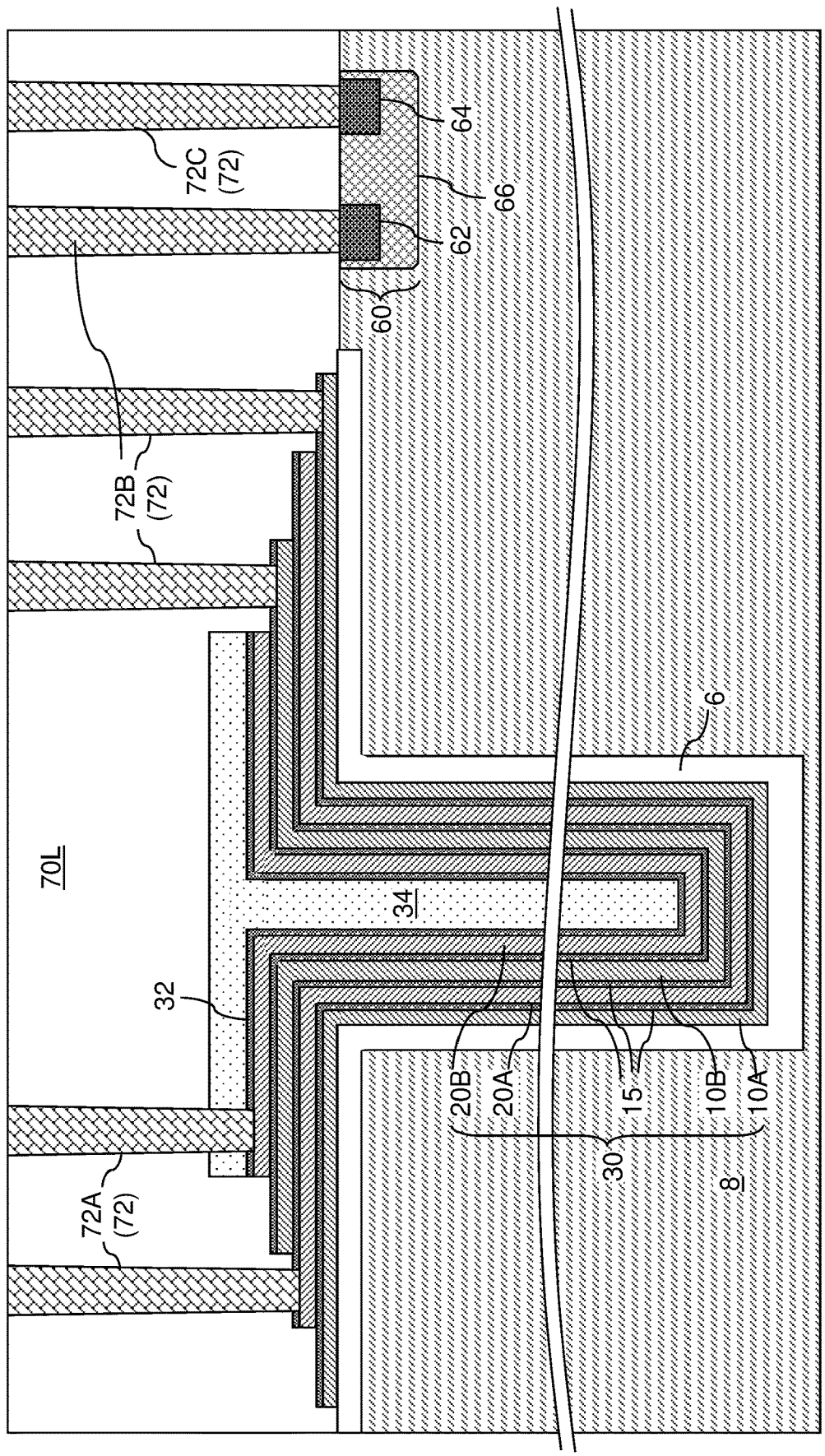
FIG. 3A is a vertical cross-sectional view along line A-A' in FIG. 3B of a region of the exemplary structure after formation of a contact-level dielectric layer and contact via structures according to an embodiment of the present disclosure.
Figure 3B:
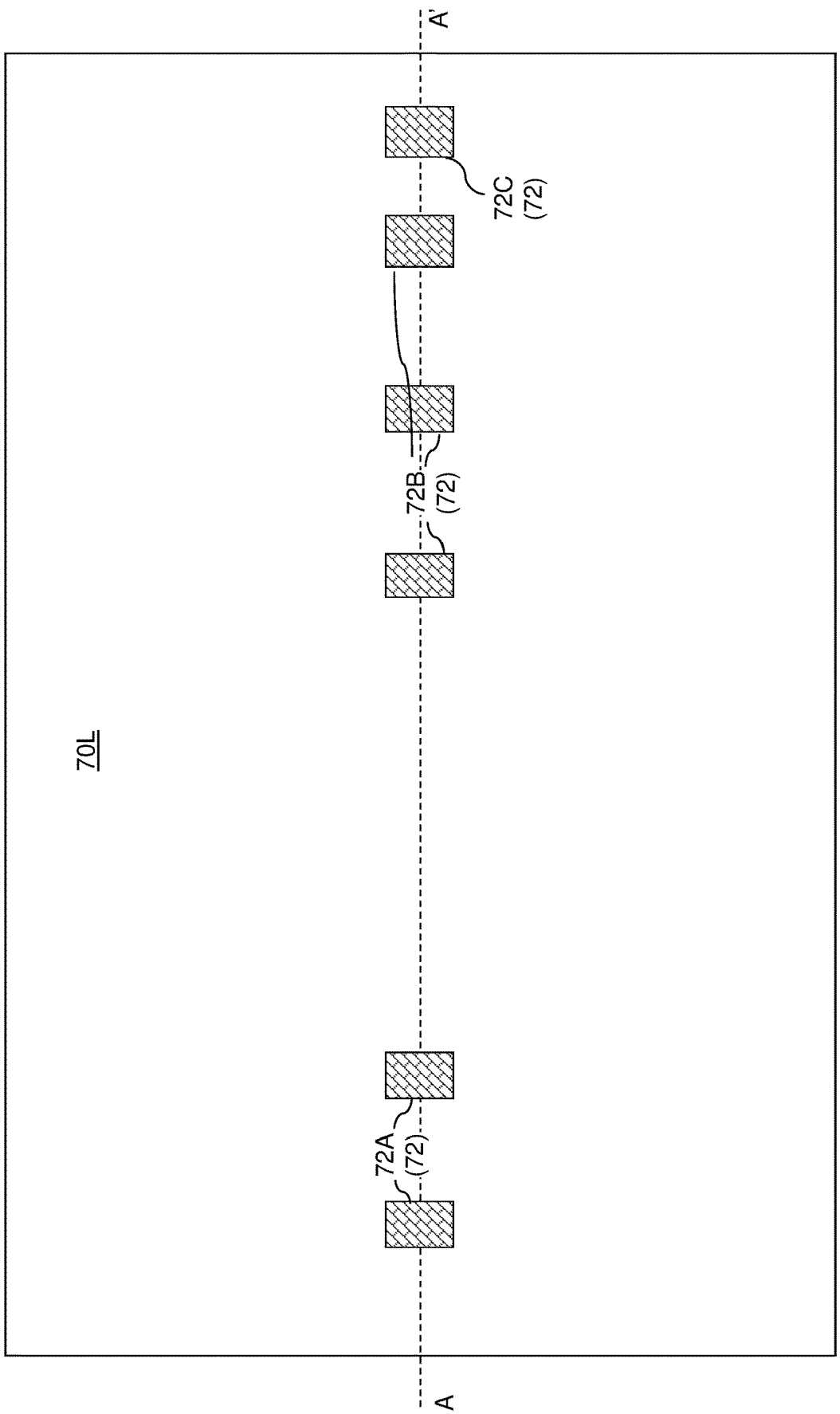
FIG. 3B is a top view of the structures shown in FIG. 3A.

FIG. 3A is a vertical cross-sectional view along line A-A' in FIG. 3B of a region of the exemplary structure after formation of a contact-level dielectric layer and contact via structures according to an embodiment of the present disclosure. FIG. 3B is a top view of the structures shown in FIG. 3A. Referring to FIGS. 3A and 3B, a planarizable dielectric material or a self-planarizing dielectric material may be deposited over the alternating layer stack (10A, 10B, 20A, 20B), the dielectric fill material layer 34, the substrate 8, and the transistor structure 60 to form a first dielectric material layer 70L. The first dielectric material layer 70L may surround the contact via structures 72 that may be connected to the alternating stack (sometimes referred to as a contact-level dielectric layer 70L), a top surface of the first terminal 62, and a top surface of the second terminal 64. The first dielectric material layer 70L may be formed over the top surface of the substrate 8, and may have a thickness in a range from 100 nm to 2,000 nm, although lesser and greater thicknesses may also be used.

Contact via structures 72, also referred to as contact-level metallic structures, may be formed through the first dielectric material layer 70L. The contact via structures 72 may be formed through the first dielectric material layer 70L on a respective one of the metallic electrode layers (10A, 10B, 20A, 20B), first terminal 62, and second terminal 64. Each of the at least three metallic electrode layers (10A, 10B, 20A, 20B) may be contacted by a respective contact via structure 72 embedded within the first dielectric material layer 70L, which overlies the horizontally-extending portion of the dielectric fill material layer 34. The contact via structures 72 may include first contact via structures 72A contacting a first subset of the at least two metallic electrode layers (e.g., 20A, 20B) that constitutes a first node of the DTC structure, second contact via structures 72B contacting a second subset of the at least two metallic electrode layers (e.g., 10A, 10B) that constitutes a second node of the DTC structure as well as a first terminal 62, and third contact via structures 72C contacting the second terminal 64. The top portions of the first dielectric material layer 70L and the contact via structures 72 may be planarized through a chemical mechanical polishing (CMP) process.

Figure 4A:
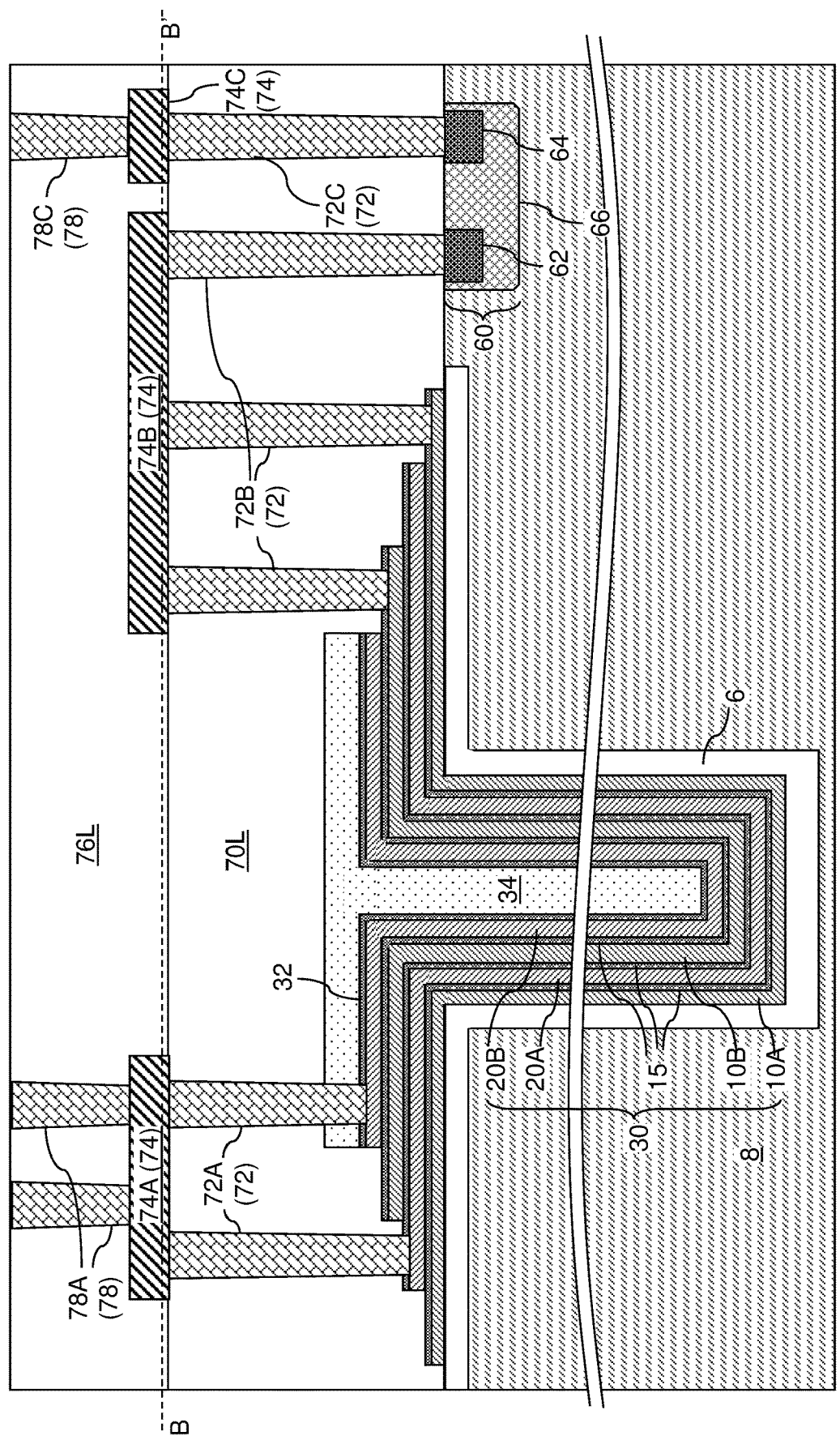
FIG. 4A is a vertical cross-sectional view along line A-A' in FIG. 4B of a region of the exemplary structure after formation of interconnect structures and interconnect-level via structures in a second dielectric material layer according to an embodiment of the present disclosure.
Figure 4B:
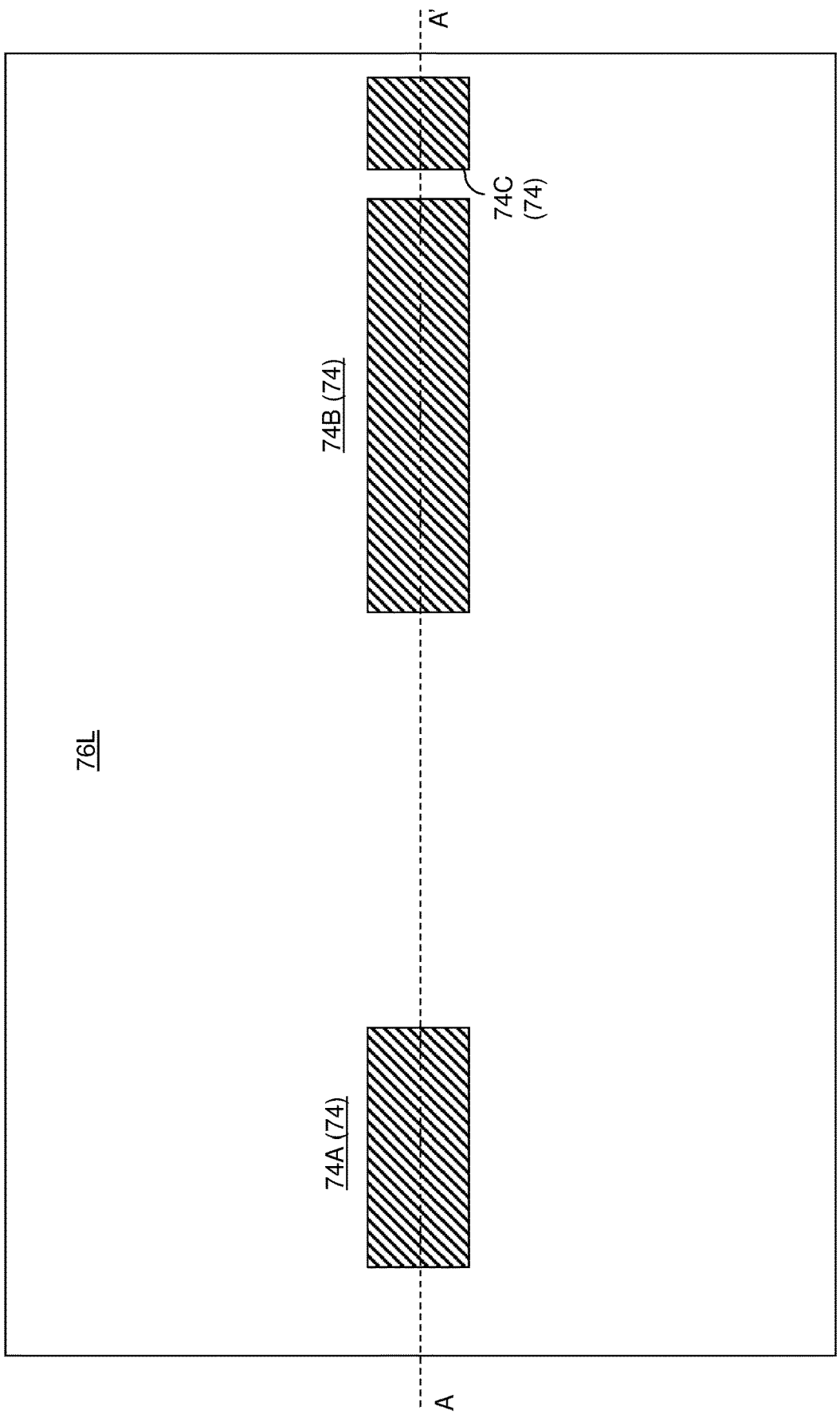
FIG. 4B is a horizontal cross-sectional view along line B-B' of FIG. 4A of the structures shown in FIG. 4A.

FIG. 4A is a vertical cross-sectional view along line A-A' in FIG. 4B of a region of the exemplary structure after formation of interconnect structures 74 and interconnect-level via structures 78 in a second dielectric material layer according to an embodiment of the present disclosure. FIG. 4B is a horizontal cross-sectional view along line B-B' of FIG. 4A of the structures shown in FIG. 4A. Referring to FIGS. 4A and 4B, a second dielectric material layer 76L and metal interconnect structures 74 may be formed over the first dielectric material layer 70L and the contact via structures 72 (first contact via structures 72A, second contact via structures 72B, third contact via structures 72C, collectively contact via structures 72). The second dielectric material layer 76L may include at least one planarizable or self-planarizable line-level dielectric material layer and/or at least one via-level dielectric material layer.

In one embodiment, the metal interconnect structures 74 may include a first metal interconnect structure 74A electrically connected to a first subset of the at least two metallic electrode layers (e.g., 20A, 20B) through the first contact via structures 72A. The metal interconnect structures 74 may further include a second metal interconnect structure 74B electrically connected to a second subset of the at least two metallic electrode layers (10A, 10B, 20A, 20B) and the first terminal 62 through the second contact via structures 72B. The metal interconnect structures 74 may further include a third metal interconnect structure 74C electrically connected to the second terminal 64 through the third contact via structure 72C. The first metal interconnect structure 74A, second metal interconnect structure 74B, and third metal interconnect structure 74C (collectively, metal interconnect structures 74) may be embedded in the second dielectric material layer 76L.

The first metal interconnect structure 74A and the second metal interconnect structure 74B may each be electrically connected to alternating metallic electrode layers of the at least two metallic electrode layers (10A, 10B, 20A, 20B). For example, as illustrated, the first metal interconnect structure 74A may be electrically connected to the metallic electrode layer 20A and the metallic electrode layer 20B through the first contact via structures 72A. The second metal interconnect structure 74B may be electrically connected to the metallic electrode layer 10A and the metallic electrode layer 10B through the second contact via structures 72B. As another example, the first metal interconnect structure 74A may be electrically connected to the metallic electrode layer 10A and the metallic electrode layer 10B through the first contact via structures 72A. The second metal interconnect structure 74B may be electrically connected to the metallic electrode layer 20A and the metallic electrode layer 20B through the second contact via structures 72B. As another example, the alternating layer stack 30 of the DTC may include six or more metallic electrode layers, and each metallic electrode layer may be electrically connected to the first metal interconnect structure 74A and the second metal interconnect structure 74B in an alternating manner.

Interconnect-level via structures 78 may be formed through the second dielectric material layer 76L. The interconnect-level via structures 78 may be formed through the second dielectric material layer 76L to contact the metal interconnect structures 74. The interconnect-level via structures 78 may include first interconnect-level via structures 78A and second interconnect-level via structure 78C. The first interconnect-level via structures 78A may be formed to contact the first metal interconnect structure 74A. The second interconnect-level via structure 78C may be formed to contact the third metal interconnect structure 74C. The top portions of the second dielectric material layer 76L and the interconnect-level via structures 78 may be planarized through a CMP process.

Figure 5A:
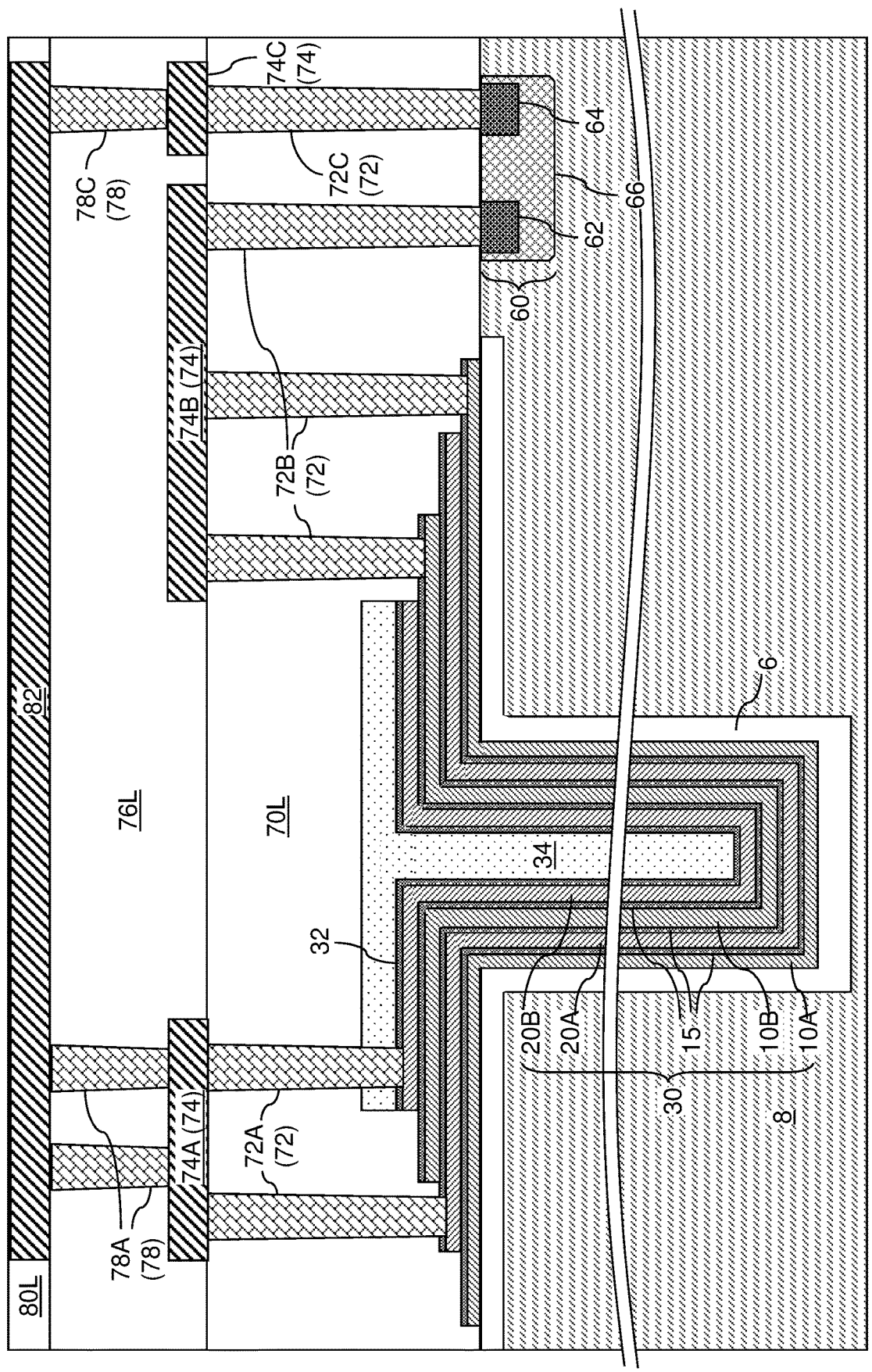
FIG. 5A is a vertical cross-sectional view along line A-A' in FIG. 5B of a region of the exemplary structure after formation of a metallic cap plate in another contact-level dielectric layer according to an embodiment of the present disclosure.
Figure 5B:
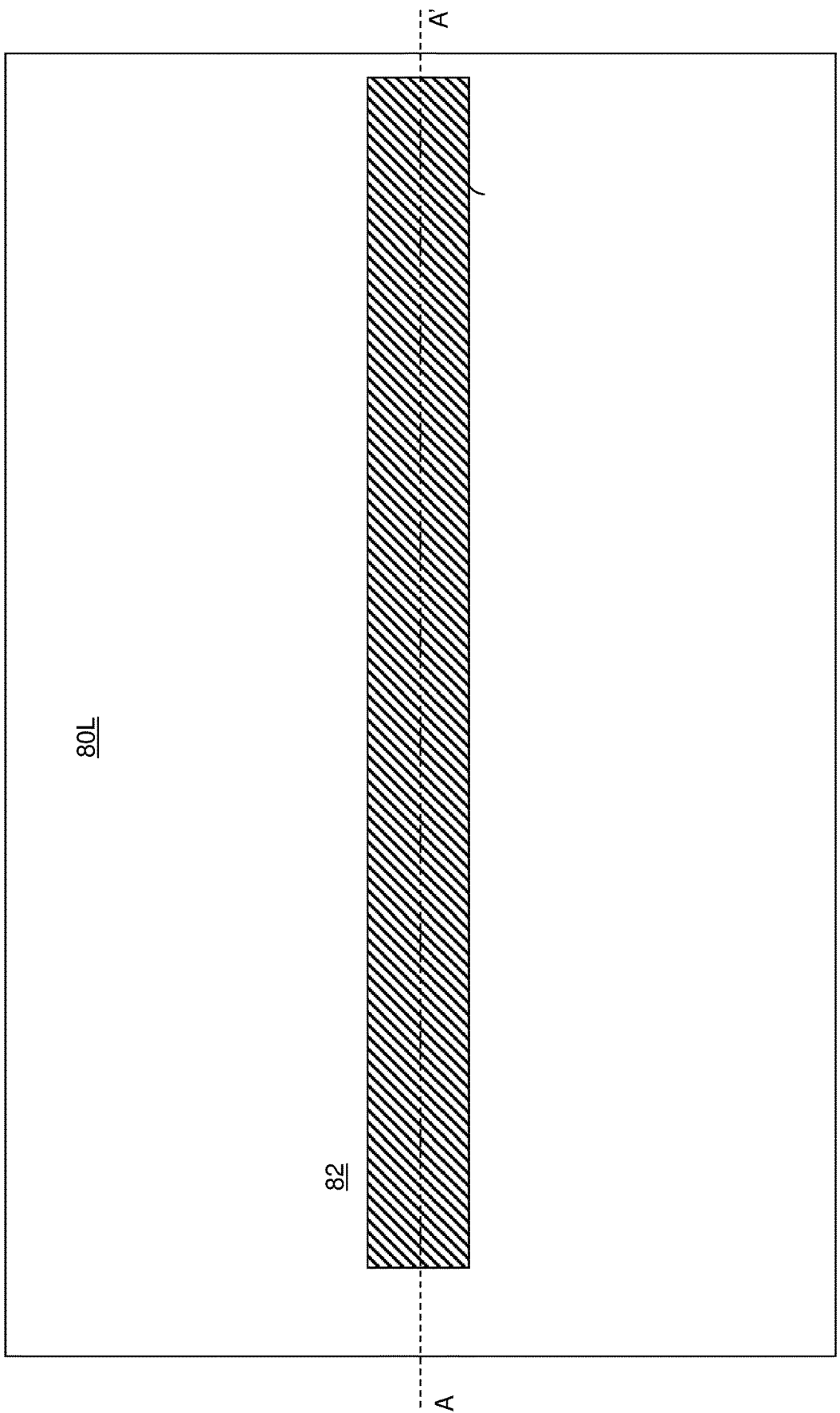
FIG. 5B is a top view of the structures shown in FIG. 5A.

FIG. 5A is a vertical cross-sectional view along line A-A' in FIG. 5B of a region of the exemplary structure after formation of a metallic cap plate in another contact-level dielectric layer according to an embodiment of the present disclosure. FIG. 5B is a top view of the structures shown in FIG. 5A. Referring to FIGS. 5A and 5B, a third dielectric material layer 80L and metallic cap plate 82 may be formed over the second dielectric material layer 76L and the interconnect-level via structures 78 (first interconnect-level via structures 78A and second interconnect-level via structures 78C). The third dielectric material layer 80L may include at least one planarizable or self-planarizable line-level dielectric material layer and/or at least one via-level dielectric material layer. The metallic cap plate 82 may be a metal interconnect structure that may be electrically connected to a respective one of the at least two metallic electrode layers (10A, 10B, 20A, 20B) through first interconnect-level via structures 78A, first metal interconnect structure 74A, and first contact via structures 72A. The metallic cap plate 82 may be electrically connected to the second terminal 64 of the transistor structure 60 through the second interconnect-level via structure 78C, third metal interconnect structure 74C, and third contact via structure 72C. Thus, the metallic cap plate 82 may effectively electrically connect at least one of the metallic electrode layers (10A, 10B, 20A, 20B) (e.g., 20A, 20B as illustrated) to the second terminal 64 of the transistor structure 60.

The resulting structure as illustrated in FIGS. 5A and 5B may form parallel circuit connection between the DTC and the transistor structure 60. For example, a first series of connecting structures, including second contact via structures 72B and second metal interconnect structure 74B, may electrically connect a first metallic electrode layer (e.g., 10A, 10B) and the first terminal 62. A second series of connecting structures, including first and third contact via structures (72A, 72C), first and second interconnect-level via structures (78A, 78C) and at least one metal interconnect structure (74A, 74C, 82), may electrically connect a second metallic electrode layer (e.g., 20A, 20B) and the second terminal 64.

The transistor structure 60 may eliminate or reduce the effects of structural damage that may occur during a high voltage breakdown event. For example, the transistor structure 60 may be a BJT structure having a base 66, as well as an emitter 62 and collector 64 electrically connected to alternating layers of the at least two metallic electrode layers (10A, 10B, 20A, 20B). The BJT structure may be designed such that the breakdown voltage value of the BJT structure is less than that of the node dielectric layers 15. Thus, the BJT structure may activate before the voltage differential between any two adjacent metallic electrode layers of the at least two metallic electrode layers (10A, 10B, 20A, 20B) reaches the voltage breakdown value for the node dielectric layers 15. The activated BJT structure may begin relaying current between the emitter 62 and collector 64, effectively dissipating any excess voltage across any two adjacent metallic electrode layers. In this manner, structural damage to the deep trench capacitor may be avoided by reducing the voltage differential and attempting to reach a voltage equilibrium between any two metallic electrode layers exhibiting a high voltage differential. After the discharge of the voltage breakdown, the BJT structure may cease relaying current between the first terminal 62 (i.e., emitter) and the second terminal 64 (i.e., collector), and the DTC may continue to operate normally.

The voltage breakdown value for the node dielectric layers 15 may depend on the thickness of each individual node dielectric layer as well as the material composition used to form the node dielectric layers 15. In one embodiment, a voltage breakdown value for a node dielectric layer of the node dielectric layers 15 may be greater than or equal to 5V. Thus, a voltage differential between two adjacent metallic electrode layers (e.g., metallic electrode layers (10A to 20A; 20A to 10B, or 10B to 20B)) greater than 5V may induce a voltage breakdown event in conventional DTCs. The various embodiments allow for dissipation of voltage differentials between metallic electrode layers of greater than 5V.

Referring to FIGS. 2A-5B, an exemplary configuration of contact via structures 72, metal interconnect structures 74, interconnect-level via structures 78, and a metallic cap plate 82 is illustrated to electrically connect alternating metallic electrode layers (10A, 20A, 10B, 20B) to the first terminal 62 and the second terminal 64. However, any configuration, number, and/or orientation of contact via structures, metal interconnect structures, interconnect-level via structures and metallic cap plates may be formed to electrically connect the first terminal 62 and the second terminal 64 to alternating metallic electrode layers (i.e., 10A, 10B, 20A, 20B) of the DTC.

Figure 6:
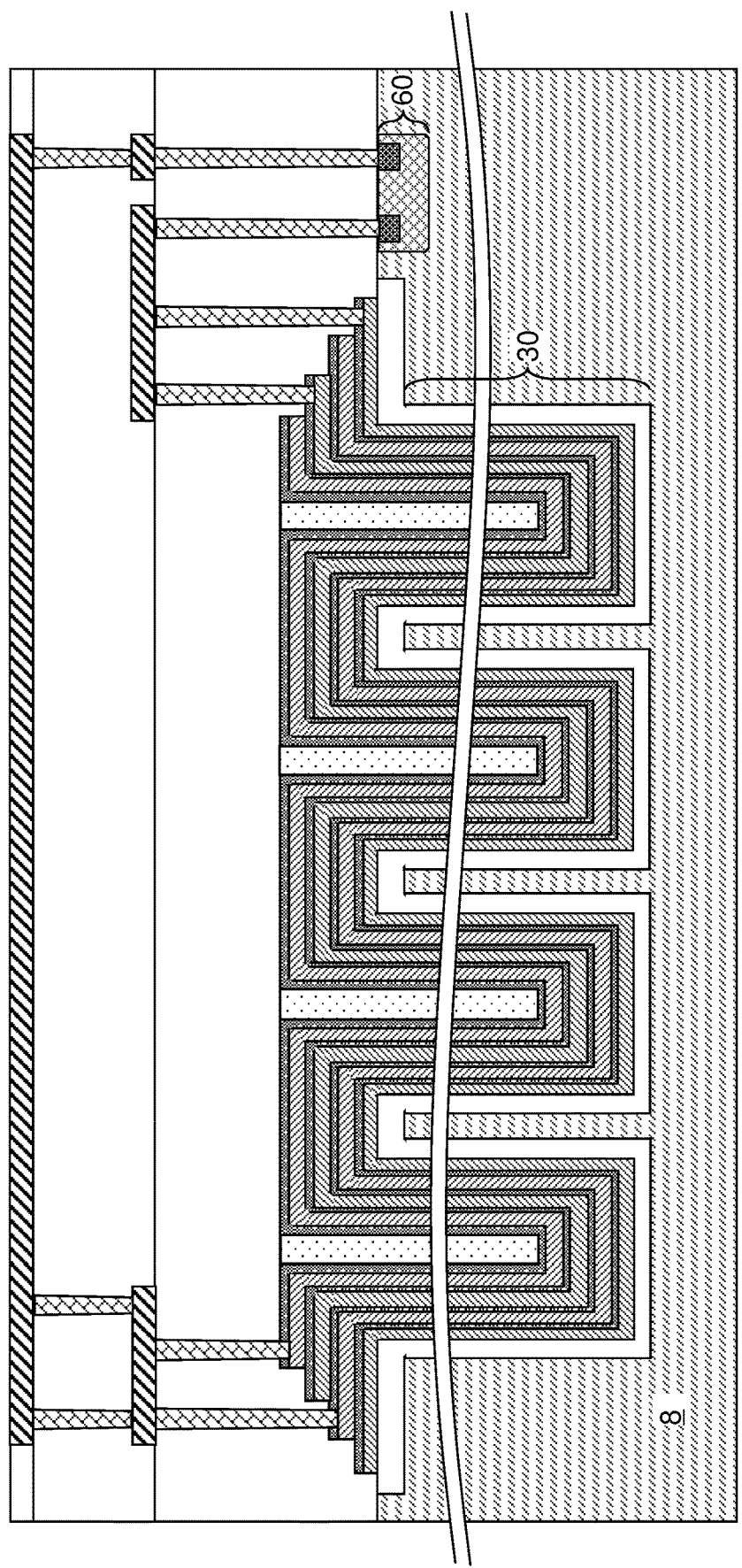
FIG. 6 is a vertical cross-sectional view of a region of the exemplary structure including multiple deep trench capacitor structures according to an embodiment of the present disclosure.

FIG. 6 is a vertical cross-sectional view of a region of the exemplary structure including multiple DTC structures according to an alternative embodiment of the present disclosure. Referring to FIG. 6, one embodiment is illustrated implementing multiple DTCs in a series in conjunction with the transistor structure 60. As previously described, for ease of illustration, FIGS. 2A-5B include one DTC implemented with the transistor structure 60. FIG. 6 is provided to illustrate that the methods and devices as described with reference to FIGS. 2A-5B may be implemented with one or more DTCs in series, or in a "daisy-chain" fashion.

Figure 7:
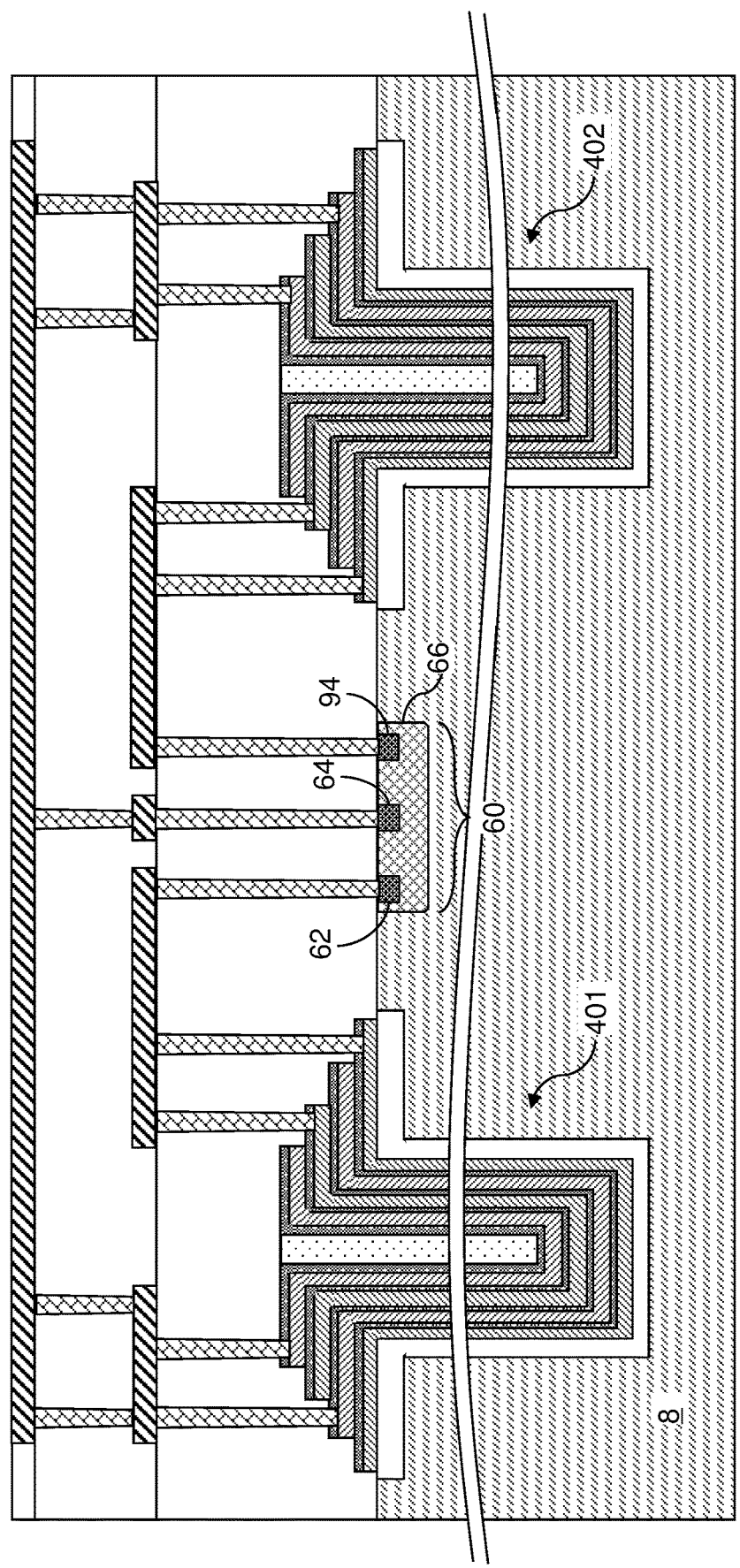
FIG. 7 is a vertical cross-sectional view of a region of the exemplary structure including a transistor structure having more than two terminals according to an embodiment of the present disclosure.

FIG. 7 is a vertical cross-sectional view of a region of the exemplary structure including a transistor structure having more than two terminals according to an embodiment of the present disclosure. Referring to FIG. 7, the transistor structure 60 may be doped to have more than two terminals. Methods for doping N-type or P-type terminals of the transistor structure 60 as described with reference to FIG. 2A may be replicated to form more than two terminals. For example, a transistor structure 60 may be doped to form a first terminal 62, a second terminal 64, a third terminal 94, and any subsequent number of terminals within a base 66 depending on the associated DTC application (e.g., number of DTCs, number of DTC chains, number of DTCs in each DTC chain, etc.). As shown, the transistor structure 60 is doped to have three terminals: The first terminal 62 may be electrically connected to alternating layers of the DTC 401 layer stack. The third terminal 94 may be electrically connected to alternating layers of the DTC 402 layer stack. The second terminal 64 may be electrically connected to remaining alternating layers of the DTC 401 layer stack and DTC 402 layer stack. A transistor structure such as transistor structure 60 having more than two terminals may be used to provide voltage breakdown protection for more than one DTC (e.g., DTC 401 and DTC 402) and/or more than one series of DTCs.

Figure 8B:
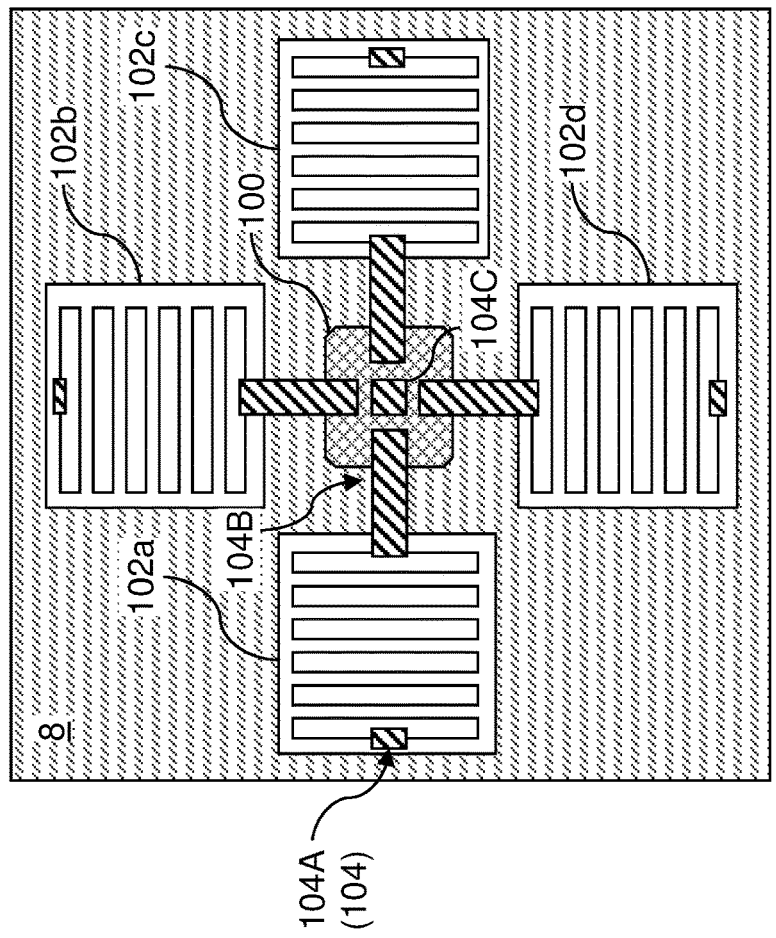
FIG. 8B is a top-down view of the exemplary structure after formation of metal interconnect structures according to an embodiment of the present disclosure.
Figure 8A:
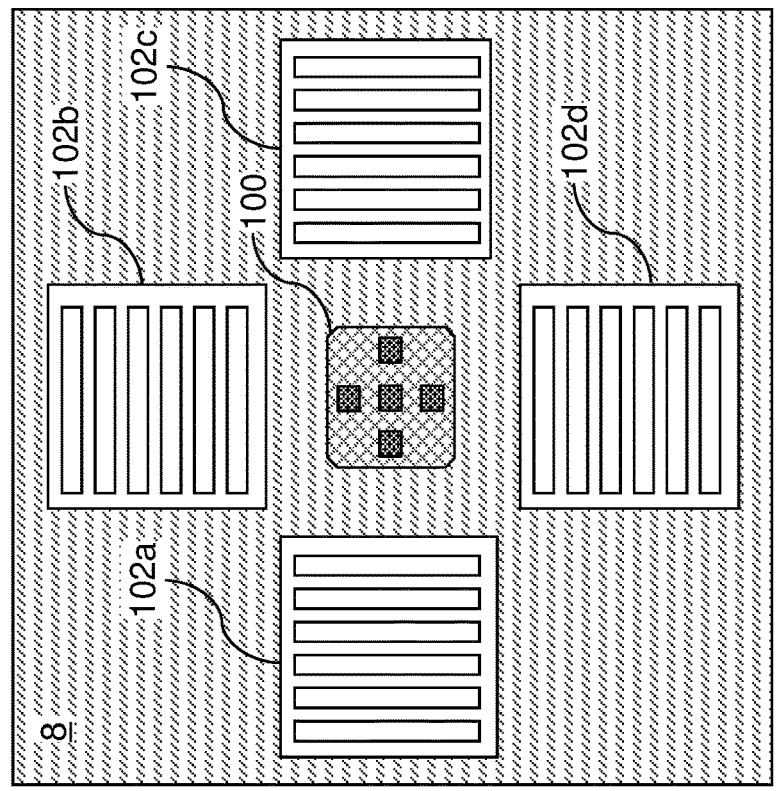
FIG. 8A is a top-down view of the exemplary structure after formation of a multi-terminal transistor-like structure and multiple series of deep trench capacitors according to an embodiment of the present disclosure.
Figure 8C:
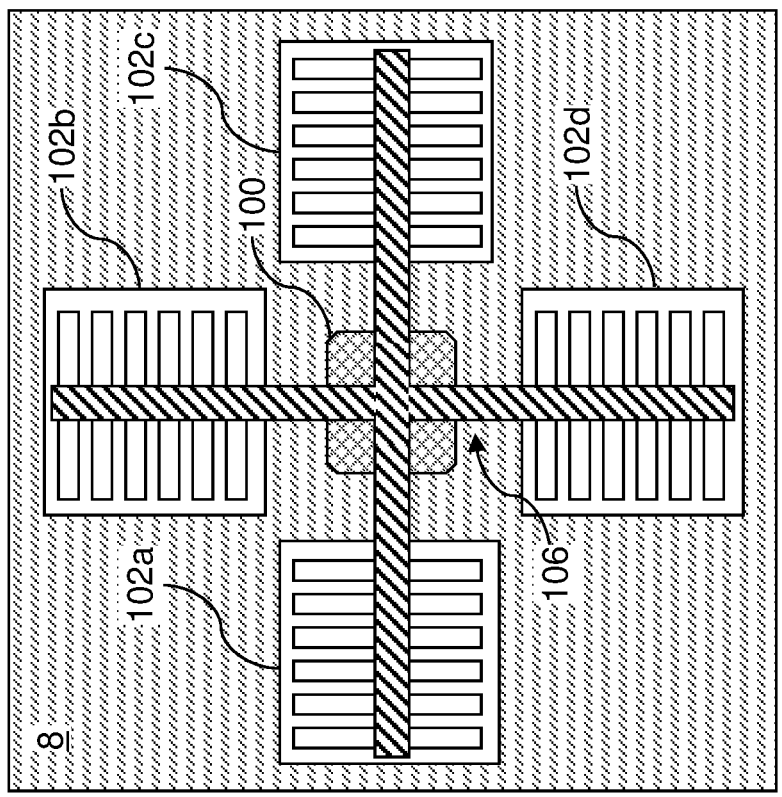
FIG. 8C is a top-down view of the exemplary structure after formation of additional metal interconnect structures according to an embodiment of the present disclosure.

FIGS. 8A-8C illustrate an example embodiment in which a single multi-terminal transistor-like structure may be used to support multiple sets of DTCs for reducing and/or eliminating the occurrence of structural damage caused by potential voltage breakdown events within each set of DTCs. Similar to the top-down view of FIG. 2B, FIG. 8A is a top-down view of the exemplary structure after formation of a multi-terminal transistor-like structure 100 and multiple series of DTCs 102a, 102b, 102c, and 102d according to an embodiment of the present disclosure. Referring to FIG. 8A, a multi-terminal, or multi-doped region, transistor-like structure 100 and multiple series of DTCs 102a, 102b, 102c, and 102d may be formed within the substrate 8 in accordance with the processes as described with reference to FIGS. 2A and 2B. Each series of DTCs 102a, 102b, 102c, and 102d may include one or more DTCs (e.g., daisy chained DTC as in FIG. 6). The transistor-like structure 100 may include a central terminal (e.g., second terminal 64 in FIGS. 2A, 7) or doped region, and as many outer terminals (e.g., first terminal 62 and third terminal 94 in FIGS. 2A, 7) or doped regions as there are a corresponding number of DTC sets. As illustrated, the transistor-like structure 100 may have a central terminal and four outer terminals corresponding to four sets of DTCs. However, fewer or more outer terminals may be implemented to correspond to the number of DTCs or sets of DTCs to be supported within an application.

FIG. 8B is a top-down view of the exemplary structure after formation of metal interconnect structures 104 (similar to metal interconnect structures 74 in FIG. 4B with second dielectric layer 76L not shown)) according to an embodiment of the present disclosure. Referring to FIG. 8B, metal interconnect structures 104B and underlying contact via structures (not shown) may be formed to electrically connect each outer terminal 62 of the transistor-like structure 100 with metallic electrode layers of each corresponding series of DTCs 102a, 102b, 102c, and 102d in a similar manner as forming the metal interconnect structures 74B and underlying contact via structures 72B as described with reference to FIGS. 3A-6. For example, an outer terminal 62, 94 of the transistor-like structure 100 may be electrically connected to one or more metallic electrode layers of a proximal DTC of one set of DTCs through the metal interconnect structure 104B and corresponding contact via structures (not shown) below the metal interconnect structure 104B. For ease of illustration, dielectric layers are not shown. Metal interconnect structures 104A and underlying contact via structures (not shown) may be formed to electrically connect to additional metallic electrode layers of each corresponding series of DTCs 102a, 102b, 102c, and 102d in a similar manner as forming the metal interconnect structures 74A and underlying contact via structures 72A as described with reference to FIGS. 3A-6. Metal interconnect structure 104C and underlying contact via structures (not shown) may be formed to electrically connect to the central terminal 64 of the transistor-like structure 100 in a similar manner as forming the metal interconnect structure 74C and underlying contact via structure 72C as described with reference to FIGS. 4A-6.

FIG. 8C is a top-down view of the exemplary structure after formation of additional metal interconnect structures 106 according to an embodiment of the present disclosure. Referring to FIG. 8C, a metal interconnect structures 106 and underlying interconnect-level via structures (not shown) may be formed to electrically connect a central terminal 64 of the transistor-like structure 100 with metallic electrode layers of each corresponding series of DTCs 102a, 102b, 102c, and 102d in a similar manner as forming the metallic cap plate 82 and underlying interconnect-level via structures (78A, 78C) as described with reference to FIGS. 5A-6. For example, a central terminal 64 of the transistor-like structure 100 may be electrically connected to one or more metallic electrode layers of a furthest DTC of each set of DTCs through a metal interconnect structures 104A and 104C and corresponding contact via structures and interconnect-level via structures below the metal interconnect structure 106. For ease of illustration, dielectric layers are not shown. In one embodiment, the metal interconnect structure 106 may be formed as single structure. In one embodiment, the metal interconnect structure 106 may be formed as separate portions on a same or different dielectric layer as each other portion, in which each portion of the metal interconnect structure 106 is electrically connected to the central terminal. The resulting structure as described with reference to FIG. 8C including the transistor-like structure 100 and series of DTCs 102a, 102b, 102c, and 102d may allow the transistor-like structure 100 to act as a fuse for each grouping of DTCs, in which the transistor-like structure 100 may be designed to tolerate the maximum allowed voltage breakdown across each series of DTCs 102a, 102b, 102c, and 102d.

Figure 9:
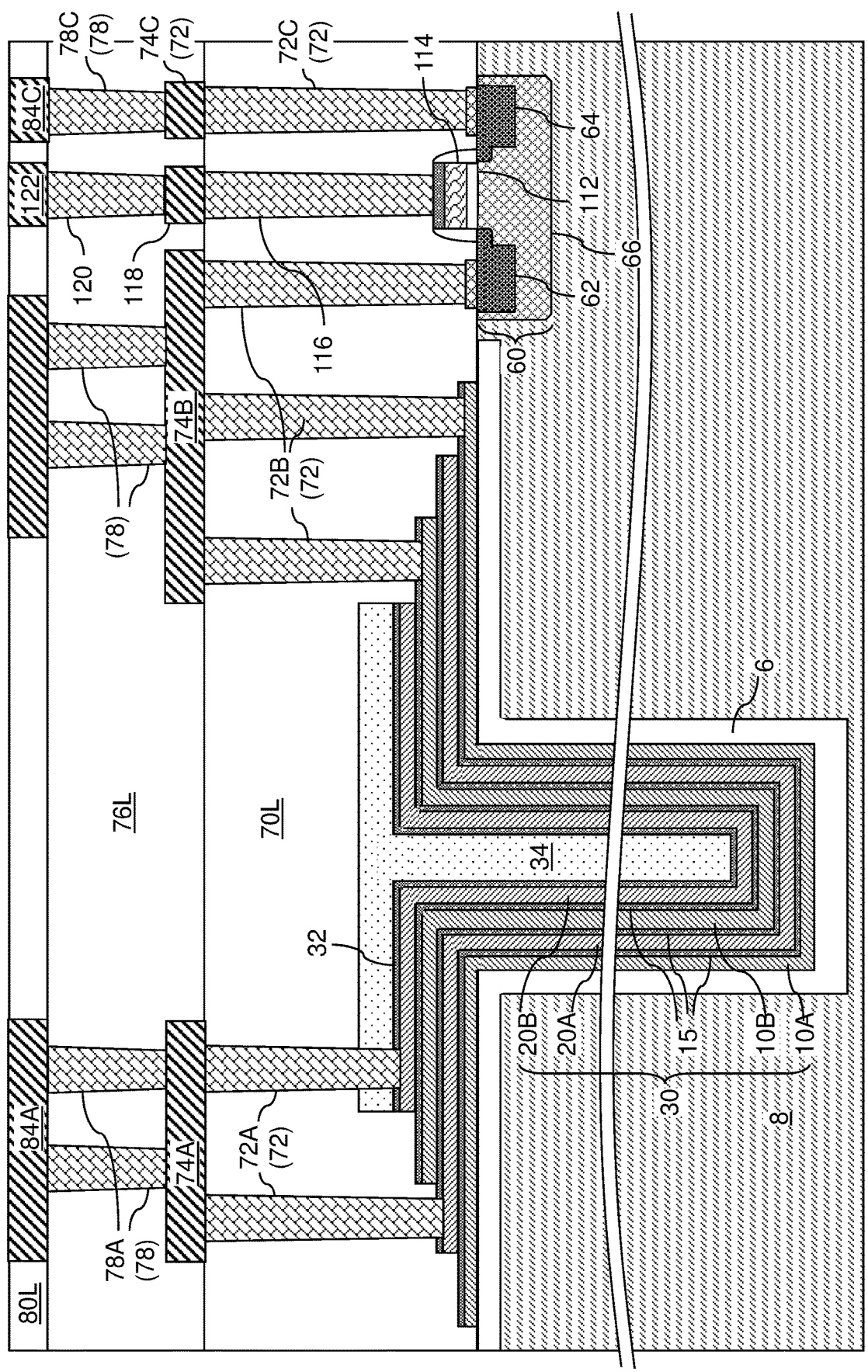
FIG. 9 is a vertical cross-sectional view of a region of a first alternate embodiment of the exemplary structure including a gate of the transistor structure connected to ground according to an embodiment of the present disclosure.

FIG. 9 is a vertical cross-sectional view of a region of a first alternate embodiment of the exemplary structure including a gate of the transistor structure connected to ground according to an embodiment of the present disclosure. Referring to FIG. 9, a gate electrode 114 may be formed in conjunction with or after the formation of structures described with respect to FIG. 2A. A gate dielectric layer 112 may be formed, for example, by thermal oxidation of a surface portion of the base 66 including the surface portions of the first terminal 62 and the second terminal 64. A gate electrode 114 material layer (which can include polysilicon and/or at least one metallic material) may be deposited over the gate dielectric layer 112. In embodiments in which the gate electrode 114 material layer includes a polysilicon, material regions of the polysilicon material to be used as gate electrodes 114 can be suitably implanted with p-type dopants or n-type dopants. The gate electrode 114 material layer and the gate dielectric layer 112 may be subsequently patterned, for example, by applying and patterning a photoresist layer over the gate electrode material layer into a pattern of gate electrodes 114, and by anisotropically etching unmasked portions of the gate electrode 114 material layer and the gate dielectric layer 112. The patterned portion of the gate dielectric layer comprises a gate dielectric layer 112, and the patterned portion of the gate electrode material layer comprises a gate electrode 114.

In one embodiment, the first terminal 62 and the second terminal 64 may be lightly doped (e.g., lightly doped drain ("LDD")). Lightly doping the first terminal 62 and the second terminal 64 may reduce the amount of current leakage between the terminals (i.e., between the drain and source in the context of a BJT-like structure). Lightly doping may refer to the ratio of impurity, or doped, atoms compared to pure, or non-doped atoms within a given volume or region of a structure capable of being doped. In one embodiment, lightly doped may refer to a doping ratio of greater than or equal to 1 impurity atom per $10^{\wedge}10$ atoms. In one embodiment, the distance between lightly doped portions of the first terminal 62 and the second terminal 64, otherwise referred to as the gate channel length, may be less than 1 micrometer.

Gate spacers may be formed on the sidewalls of each gate structure (112, 114) including the gate dielectric layer 112 and a gate electrode 114. In one embodiment, P-type dopants may be implanted prior to, and/or after, formation of the gate spacers into portions of the base 66 that are not masked by the gate structure (112, 114) to form an N-type first terminal 62 and an N-type second terminal 64. In one embodiment, N-type dopants may be implanted prior to, and/or after, formation of the gate spacers into portions of the base 66 that are not masked by the gate structure (112, 114) to form a P-type first terminal 62 and a P-type second terminal 64. The dielectric value of the gate dielectric may be less than the dielectric value of the node dielectric 15.

In one embodiment, the gate dielectric layer 112, similar to the base 66, may have a dielectric value less than the dielectric value of each node dielectric layer of the node dielectric layers 15. In other words, the gate dielectric layer 112 may have a voltage breakdown value that is less than the voltage breakdown value of each of the node dielectric layers 15. Thus, with the dielectric values of the gate dielectric layer 112 and the base 66 being less than the node dielectric layers 15, a voltage breakdown event may be induced within the transistor structure 60 to allow the flow of current between the first terminal and the second terminal and ultimately to electric ground via the gate structure (112, 114) before a voltage breakdown event may be induced within the DTC.

Contact via structure 116, interconnect-level via structure 120, and metal interconnect structures (118, 122) may be formed within the first dielectric material layer 70L, the second dielectric material layer 76L, and the third dielectric material layer 80L respectively in accordance with the processes as described with reference to FIGS. 2A-5B. The metal interconnect structure 122 may be electrically connected to electrical ground, effectively grounding the gate electrode 114 of the transistor structure 60. In some embodiments, the gate electrode 114 of the transistor structure 60 may be electrically connected to ground through another metal interconnect structure other than metal interconnect structure 122, such as metal interconnect structure 118 or any other metal interconnect structure within a different dielectric layer than dielectric layer 80L. The gate structure (112, 114) may function to control the maximum allowed voltage that the transistor structure 60 may dissipate from the metallic electrode layers (10A, 20A, 10B, 20B) in the event of excessive voltage within the alternating layer stack 30.

The first terminal 62 may be electrically connected to one or more metallic electrode layers of the DTC located at a first end (i.e., proximal end) of the DTC through a series of contact via structures 72B and metal interconnect structure 74B. The second terminal 64 may be electrically connected to one or more metallic electrode layers of the DTC located at a second end (i.e., distal end) of the DTC through a separate series of contact via structures (72A, 72C), metal interconnect structures (74A, 74C), interconnect-level via structures (78A, 78C), metal interconnect structures (84A, 84C), and a metallic cap plate. As illustrated in FIG. 9, no metal interconnect structure or metallic cap plate is currently shown as electrically connecting the second terminal 64 with the metallic electrode layers on the distal end of the DTC. However, it is to be understood that an electrical connection between the second terminal 64 and metallic electrode layers on the distal end of the DTC may be formed using any configuration of contact via structures (e.g., contact via structures 72), interconnect-level via structures (e.g., interconnect-level via structures 78), metal interconnect structures (e.g., metal interconnect structures (74, 84)), and metallic cap plates (e.g., metallic cap plate 82) formed in any dielectric layer. For example, the electrical connection between the second terminal 64 and the corresponding metallic electrode layers of the distal end of the DTC may be formed using contact via structures (e.g., contact via structures (72A, 72C)), interconnect-level via structures (e.g., interconnect-level via structures (78A, 78C)), metal interconnect structures (e.g., metal interconnect structures (74A, 74C)), and metallic cap plate (e.g., metallic cap plate 82) formed within dielectric layers 70L, 76L, and 80L (i.e. in a similar manner as described with reference to FIGS. 5A and 5B). As another example, the electrical connection between the second terminal 64 and the corresponding metallic electrode layers of the distal end of the DTC may be formed using contact via structures (e.g., contact via structures (72A, 72C)) and a metallic cap plate (e.g., metallic cap plate 82) within dielectric layers 70L and 76L, in which the metallic cap plate is formed within the dielectric layer 76L and in direct contact with the contact via structures. As another example, the electrical connection between the second terminal 64 and the corresponding metallic electrode layers of the distal end of the DTC may be formed using contact via structures (e.g., contact via structures (72A, 72C)), interconnect-level via structures (e.g., interconnect-level via structures (78A, 78C)), metal interconnect structures (e.g., metal interconnect structures (74A, 74C, 84A, 84C)), and metallic cap plate (e.g., metallic cap plate 82) formed within dielectric layers 70L, 76L, 80L, and additional dielectric layers. Similarly, an electrical connection between the first terminal 62 and the metallic electrode layers proximate to the transistor structure 60 may be formed using any configuration of contact via structures (e.g., contact via structures 72B), interconnect-level via structures, and metal interconnect structures (e.g., metal interconnect structure 74B) formed in any dielectric layer (e.g., dielectric layer 70L, 76L, 80L).

Figure 10:
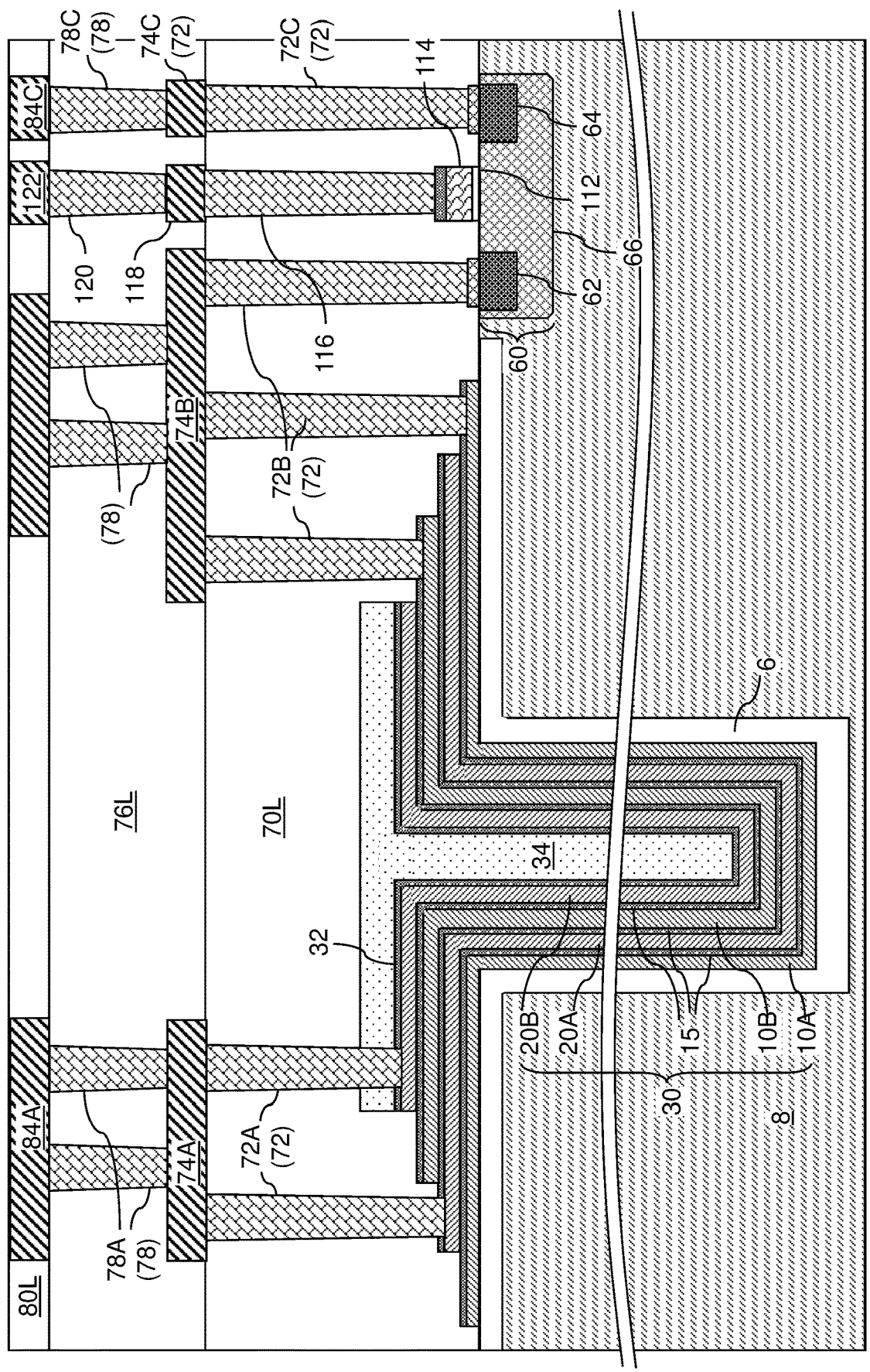
FIG. 10 is a vertical cross-sectional view of a region of a second alternate embodiment of the exemplary structure including a gate of the transistor structure operating as an ion implant mask according to an embodiment of the present disclosure.

FIG. 10 is a vertical cross-sectional view of a region of a second alternate embodiment of the exemplary structure including a gate electrode 114 of the transistor structure 60 operating as an ion implant hard mask according to an embodiment of the present disclosure. Referring to FIG. 10, an ion implant hard mask (not illustrated) may be formed over the base 66 of the transistor structure 60 and positioned between the first terminal 62 and the second terminal 64. The illustrated structures may be formed in accordance with the processes described in reference to FIG. 9. The ion implant hard mask may further protect the base 66 from damage during the doping process to form the first terminal 62 and the second terminal 64. For example, during the ion implantation process, ions may hit the surface of the base 66, often comprised of silicon, at high speeds. This high-speed ion implantation process may cause gaps within or damage to the crystal lattice structure. The ion implant mask may be implemented to prevent damage to the base 66 during the ion implantation process. In one embodiment, the distance between proximate sidewalls of the first terminal 62 and the second terminal 64 may be greater than 0.5 micrometers. Similar to the first alternate embodiment described with reference to FIG. 6, this second alternate embodiment shown in FIG. 10 allows for high voltage, electrostatic discharge protection during a potential voltage breakdown event exhibited within a DTC in which the transistor structure 60 dissipates excess voltage differential between the metallic electrode layers of the DTC. Additionally, the gate structure (112, 114) may function to control the maximum allowed voltage that the transistor structure 60 may dissipate from the metallic electrode layers (10A, 20A, 10B, 20B) in the event of excessive voltage within the alternating layer stack 30.

During the occurrence of high excess voltage within the DTC, a voltage breakdown event is instead induced in the transistor structure 60 to cause current to flow between the two doped regions (e.g., first terminal 62 and second terminal 64), therefore reducing the voltage delta between the metallic electrode layers (10A, 10B, 20A, 20B) within the DTC. Referring to FIGS. 9 and 10, the addition of the gate structure (112, 114) may help reduce the voltage delta between the DTC metallic electrode layers (10A, 10B, 20A, 20B) by allowing current flowing between the first terminal 62 and the second terminal 64 to also flow to ground. Once the voltage within the DTC metallic electrode layers (10A, 10B, 20A, 20B) falls below the voltage breakdown threshold value of the transistor structure 60, the transistor structure 60 may deactivate or otherwise turn off, therefore stopped the flow of current between the gate structure (112, 114) and electrical ground and between the first terminal 62 and the second terminal 64.

Figure 11:
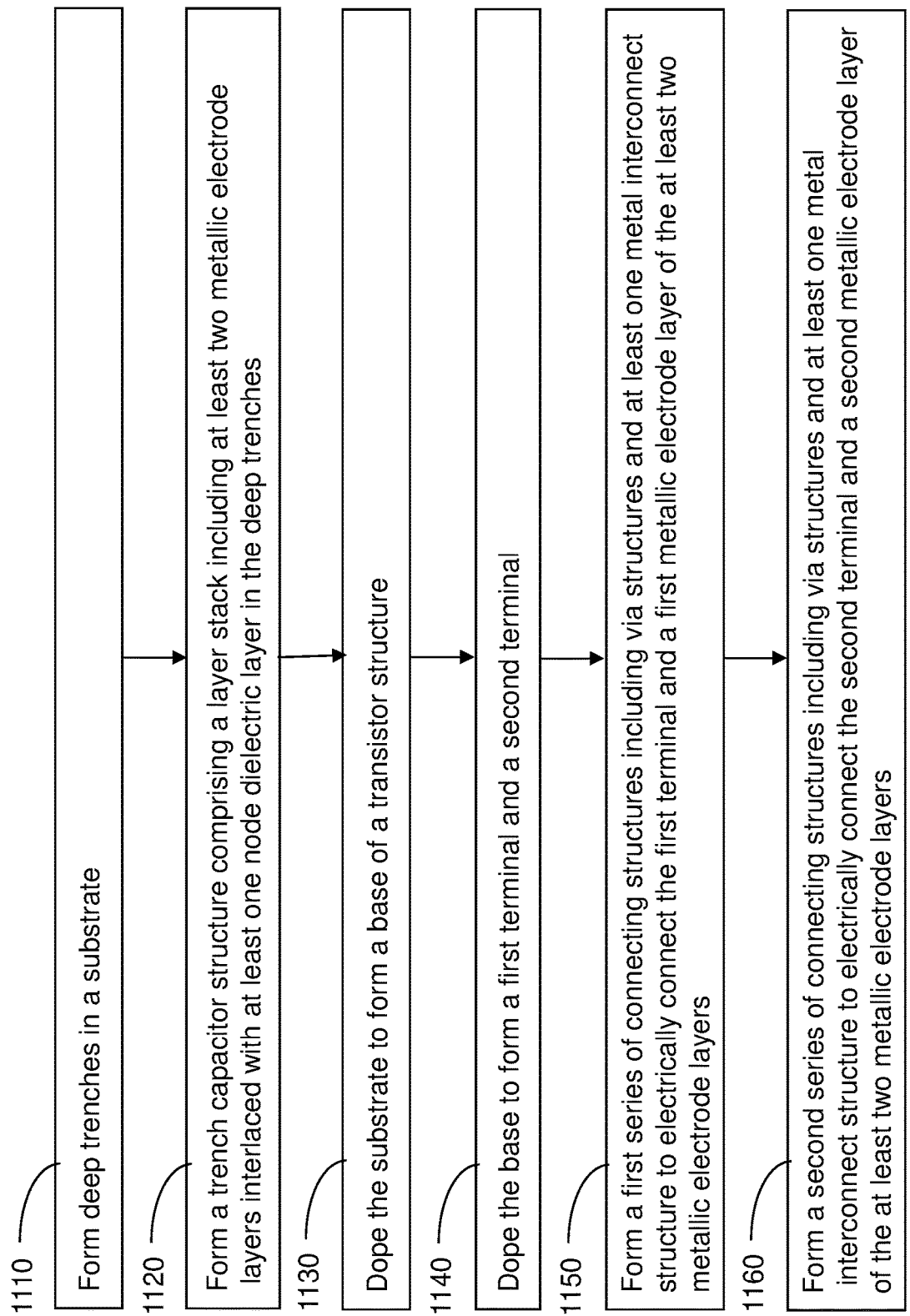
FIG. 11 is a flowchart that illustrates the general processing steps of the methods of the present disclosure.

FIG. 11 is a flowchart that illustrates the general processing steps of the methods of the present disclosure. Referring to FIG. 11, a flowchart illustrates general processing steps for forming a semiconductor device. Referring to step 1110 and FIG. 1B, deep trenches may be formed in a substrate 8. Referring to step 1120 and FIGS. 1C, 2A and 2B, a trench capacitor structure comprising a layer stack (e.g., alternating layer stack 30) including at least two metallic electrode layers interlaced with at least one node dielectric layer may be formed in the deep trenches. Referring to step 1130 and FIGS. 2A and 2B, the substrate 8 may be doped to form a base 66 of a transistor structure 60. Referring to step 1140 and FIGS. 2A and 2B, the base 66 may be doped to form a first terminal 62 and a second terminal 64. Referring to step 1150 and FIGS. 3A-5B, a first series of connecting structures including second contact via structures 72B and at least one metal interconnect structure (e.g., second metal interconnect structure 74B) may be formed to electrically connect, or electrically couple, the first terminal 62 and a first metallic electrode layer 10A of the at least two metallic electrode layers. Referring to step 1160 and FIGS. 3A-5B, a second series of connecting structures including via structures (i.e. via structures may refer generally to both contact via structures (e.g., first contact via structures 72A, third contact via structure 72C) and interconnect-level via structures (e.g., first interconnect-level via structures 78A, second interconnect-level via structure 78C)) and at least one metal interconnect structure (e.g., metal interconnect structures (74A, 74C), metallic cap plate 82) may be formed to electrically connect, or electrically couple, the second terminal 64 and a second metallic electrode layer 20A of the at least two metallic electrode layers.

In one embodiment, referring to FIGS. 3A-5B, the first terminal 62 may be electrically connected, or electrically coupled, to a third metallic electrode layer 10B of the at least two metallic electrode layers through the first series of connecting structures. In one embodiment, referring to FIGS. 3A-5B, the second terminal 64 may be electrically connected, or electrically coupled, to a fourth metallic electrode layer 20B of the at least two metallic electrode layers through the second series of connecting structures. In one embodiment, referring to FIGS. 9 and 10, a gate structure (112, 114) may be formed on top of the base 66 and positioned between the first terminal 62 and the second terminal 64. The gate structure (112, 114) may be electrically connected, or electrically coupled, to ground. In one embodiment, referring to FIG. 10, an ion implant hard mask may be implanted in the base 66 to form the first terminal 62 and the second terminal 64. A distance between proximate sidewalls of the first terminal 62 and the second terminal 64 may be defined by the ion implant hard mask and may be greater than 0.5 micrometers. In one embodiment, referring to FIG. 9, the first terminal 62 and the second terminal 64 may be lightly doped.

In one embodiment, referring to FIG. 7, a second deep trench capacitor structure 402 may be formed, in which the second deep trench capacitor structure 402 comprises a second layer stack including at least two metallic electrode layers interlaced with at least one node dielectric layer in the deep trenches. The base 66 may be doped to form a third terminal 94. Further, a third series of connecting structures including via structures (i.e., contact via structures and interconnect-level via structures) and at least one metal interconnect structure (i.e., metal interconnect structures and/or metallic cap plates) may be formed to electrically connect the third terminal 94 and a first metallic electrode layer of the second layer stack. The second series of connecting structures may electrically connect the second terminal 64 and a second metallic electrode layer of the second layer stack.

Referring to all drawings and according to various embodiments of the present disclosure, a semiconductor device is provided. The semiconductor device may include a deep trench capacitor structure, a transistor structure 60, a first series of connecting structures, and second series of connecting structures. The deep trench capacitor structure may have a layer stack (e.g., alternating layer stack 30) including a first metallic electrode layer 10A, a second metallic electrode layer 20A, and at least one node dielectric layer 15. The node dielectric layer 15 may be positioned between the first metallic electrode layer 10A and second metallic electrode layer 20A. The transistor structure 60 may include a base 66, a first terminal 62 formed within the base 66, and a second terminal 64 formed within the base 66. The first series of connecting structures may include second contact via structures 72B and at least one metal interconnect structure (e.g., second metal interconnect structure 74B). The first series of connecting structures (72B and 74B) may electrically connect, or electrically couple, the first metallic electrode layer 10A and the first terminal 62. The second series of connecting structures may include via structures (i.e., via structures may refer generally to both contact via structures (e.g., first contact via structures 72A, third contact via structure 72C) and interconnect-level via structures (e.g., first interconnect-level via structures 78A, second interconnect-level via structure 78C)) and at least one metal interconnect structure (e.g., metal interconnect structures (74A, 74C), metallic cap plate 82). The second series of connecting structures (72A, 72C, 74A, 74C, 78A, 78C, 82) may electrically connect, or electrically couple, the second metallic electrode layer 20A and the second terminal 64.

In one embodiment, the semiconductor device may have a voltage breakdown value between the first terminal (62) and the second terminal (64) is less than a voltage breakdown value between the first metallic electrode layer (10A) and the second metallic electrode layer (20A).

In one embodiment, the layer stack may include a third metallic electrode layer (10B), wherein the at least one least one node dielectric layer (15) may be positioned between the second metallic electrode layer (20A) and the third metallic electrode layer (10B); a fourth metallic electrode layer (20B), wherein the at least one least one node dielectric layer (15) may be positioned between the third metallic electrode layer (10B) and the fourth metallic electrode layer (20B), such that the first terminal (62) may be electrically connected to the third metallic electrode layer (10B) through the first series of connecting structures, and such that the second terminal is electrically connected to the fourth metallic electrode layer (20B) through the second series of connecting structures.

In one embodiment, the first terminal (62) and second terminal (64) comprise N-type material and the base (66) comprises P-type material. In one embodiment, the first terminal (62) and second terminal (64) comprise P-type material and the base (66) comprises N-type material.

In one embodiment, the transistor structure (60) may also include a third terminal (94) formed within the base (66) such that the third terminal (94) may be electrically connected to a first metallic electrode layer of a second deep trench capacitor structure (402), and such that the second terminal (64) may be electrically connected to a second metallic electrode layer of the second deep trench capacitor (402).

In one embodiment, the semiconductor device may also include a channel gate (112, 114) positioned between the first terminal (62) and the second terminal (64), such that the channel gate (112, 114) may be electrically connected to ground.

In one embodiment, the first terminal (62) and second terminal (64) may be lightly-doped regions of the base (66), such that a distance between proximate sidewalls of the first terminal (62) and the second terminal (64) is less than 1 micrometer.

In one embodiment of the semiconductor device, a distance between proximate sidewalls of the first terminal (62) and the second terminal (64) may be greater than 0.5 micrometers.

Referring to all drawings and according to various embodiments of the present disclosure, a semiconductor device is provided. The semiconductor device may include a deep trench capacitor structure and a transistor structure 60. The transistor structure 60 may include a base 66, a first terminal 62 formed within the base 66, and a second terminal 64 formed within the base 66, in which the first terminal 62 and the second terminal 64 may be formed by doping the base 66. The deep trench capacitor structure may include a first metallic electrode layer (10A, 10B) and a second metallic electrode layer (20A, 20B). The first terminal 62 may be electrically connected to the first metallic electrode layer (10A, 10B), and the second terminal 64 may be electrically connected to the second metallic electrode layer (20A, 20B).

In one embodiment, the transistor structure (60) may also include a channel gate (112, 114) formed on top of the base (66), such that the channel gate (112, 114) may be electrically connected to ground.

In one embodiment, the transistor structure (60) may be a bipolar junction transistor. In one embodiment, the transistor structure (60) may be a metal-oxide-semiconductor field-effect transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first deep trench capacitor comprising:
        a first metallic electrode layer;
        a second metallic electrode layer; and
        a node dielectric layer separating the first metallic electrode layer from the second metallic electrode layer; and
    a transistor structure comprising:
        a first terminal electrically connected to the first metallic electrode layer; and
        a second terminal electrically connected to the second metallic electrode layer;
    wherein a first voltage breakdown value between the first terminal and the second terminal is less than a second voltage breakdown value between the first metallic electrode layer and the second metallic electrode layer.

2. The semiconductor device of claim 1, further comprising:
    a first series of connecting structures including first via structures and at least one first metal interconnect structure electrically connecting the first metallic electrode layer and the first terminal; and
    a second series of connecting structures including second via structures and at least one second metal interconnect structure electrically connecting the second metallic electrode layer and the second terminal.

3. The semiconductor device of claim 2, wherein the first deep trench capacitor further comprises:
    a third metallic electrode layer, wherein the node dielectric layer is positioned between the second metallic electrode layer and the third metallic electrode layer; and
    a fourth metallic electrode layer, wherein the node dielectric layer is positioned between the third metallic electrode layer and the fourth metallic electrode layer,
    wherein the first terminal is electrically connected to the third metallic electrode layer through the first series of connecting structures, and
    wherein the second terminal is electrically connected to the fourth metallic electrode layer through the second series of connecting structures.

4. The semiconductor device of claim 1, wherein the transistor structure further comprises:
    a base; and
    a channel gate formed on top of the base,
    wherein the first terminal and the second terminal are formed in the base, and
    wherein the channel gate is electrically connected to ground.

5. The semiconductor device of claim 4, further comprising:
    a second deep trench capacitor comprising a third metallic electrode layer and a fourth metallic electrode layer;

a third terminal formed within the base,
wherein the third terminal is electrically connected to the third metallic electrode layer, and
wherein the second terminal is electrically connected to the fourth metallic electrode layer.

6. The semiconductor device of claim 1, wherein the transistor structure is a bipolar junction transistor.

7. The semiconductor device of claim 1, wherein the transistor structure is a metal-oxide-semiconductor field-effect transistor.

8. The semiconductor device of claim 1, wherein the transistor structure further comprises a channel gate positioned between the first terminal and the second terminal, wherein the channel gate is electrically connected to ground.

9. A semiconductor device, comprising:
a deep trench capacitor comprising:
a first metallic electrode layer;
a second metallic electrode layer; and
a node dielectric layer separating the first metallic electrode layer from the second metallic electrode layer; and
a deep trench capacitor fuse comprising:
a first terminal electrically connected to the first metallic electrode layer; and
a second terminal electrically connected to the second metallic electrode layer,
wherein a first voltage breakdown value between the first terminal and the second terminal is less than a second voltage breakdown value between the first metallic electrode layer and the second metallic electrode layer.

10. The semiconductor device of claim 9, wherein the deep trench capacitor fuse is a transistor structure comprising:
a base;
a first doped region of the base that forms the first terminal; and
a second doped region of the base that forms the second terminal formed.

11. The semiconductor device of claim 10, wherein:
the first terminal and the second terminal comprise an n-type material and the base comprises a p-type material; or
the first terminal and the second terminal comprise the p-type material and the base comprises the n-type material.

12. The semiconductor device of claim 10, wherein the first terminal and the second terminal are lightly-doped regions of the base, and wherein a distance between proximate sidewalls of the first terminal and the second terminal is less than 1 micrometer.

13. The semiconductor device of claim 10, wherein a distance between proximate sidewalls of the first terminal and the second terminal is greater than 0.5 micrometers.

14. The semiconductor device of claim 9, further comprising:
a first series of connecting structures including first via structures and at least one first metal interconnect structure electrically connecting the first metallic electrode layer and the first terminal; and
a second series of connecting structures including second via structures and at least one second metal interconnect structure electrically connecting the second metallic electrode layer and the second terminal.

15. The semiconductor device of claim 14, wherein the deep trench capacitor further comprises:
a third metallic electrode layer, wherein the node dielectric layer is positioned between the second metallic electrode layer and the third metallic electrode layer; and
a fourth metallic electrode layer, wherein the node dielectric layer is positioned between the third metallic electrode layer and the fourth metallic electrode layer,
wherein the first terminal is electrically connected to the third metallic electrode layer through the first series of connecting structures, and
wherein the second terminal is electrically connected to the fourth metallic electrode layer through the second series of connecting structures.

16. A method of forming a semiconductor device, comprising:
forming a deep trench capacitor in a substrate, the deep trench capacitor comprising:
a first metallic electrode layer;
a second metallic electrode layer; and
a node dielectric layer separating the first metallic electrode layer from the second metallic electrode layer; and
forming a transistor structure by:
doping the substrate to form a base of the transistor structure;
and doping the base to form a first terminal and a second terminal,
the transistor structure comprising:
the first terminal electrically connected to the first metallic electrode layer; and
the second terminal electrically connected to the second metallic electrode layer.

17. The method of claim 16, further comprising:
forming a first series of connecting structures including first via structures and at least one first metal interconnect structure electrically connecting the first terminal to the first metallic electrode layer; and
forming a second series of connecting structures including second via structures and at least one second metal interconnect structure electrically connecting the second terminal to the second metallic electrode layer.

18. The method of claim 16, wherein forming the transistor structure further comprises forming the transistor structure as a bipolar junction transistor or as a metal-oxide-semiconductor field-effect transistor.

19. The method of claim 16, wherein forming the transistor structure further comprises forming the transistor structure to have a first voltage breakdown value between the first terminal and the second terminal that is less than a second voltage breakdown value between the first metallic electrode layer and the second metallic electrode layer.

20. The method of claim 16, further comprising:
forming a gate structure on top of the base that is positioned between the first terminal and the second terminal; and
electrically coupling the gate structure to ground.

* * * * *